(12) United States Patent
Iida et al.

(10) Patent No.: US 8,089,310 B2
(45) Date of Patent: Jan. 3, 2012

(54) CHARGE DOMAIN FILTER CIRCUIT

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/273,158

(22) Filed: Nov. 18, 2008

(65) Prior Publication Data

US 2009/0134916 A1    May 28, 2009

(30) Foreign Application Priority Data

Nov. 26, 2007    (JP) ................. P2007-304984

(51) Int. Cl.
*H03B 1/00* (2006.01)

(52) U.S. Cl. .................. 327/551; 327/231; 327/355
(58) Field of Classification Search .......... 327/231–235, 327/241, 248, 355, 361, 551
See application file for complete search history.

(56) References Cited

U.S. PATENT DOCUMENTS

| | | | |
|---|---|---|---|
| 4,475,170 A | | 10/1984 | Haque |
| 4,689,762 A | * | 8/1987 | Thibodeau, Jr. .............. 708/409 |
| 5,311,457 A | * | 5/1994 | Shizawa ........................ 708/316 |
| 5,945,862 A | * | 8/1999 | Donnelly et al. ............. 327/278 |
| 6,751,643 B2 | * | 6/2004 | Jaber ............................. 708/409 |

FOREIGN PATENT DOCUMENTS

| | | | |
|---|---|---|---|
| JP | 05-14130 | | 1/1993 |
| JP | 5-14130 | * | 1/1993 |
| JP | 05-335888 | | 12/1993 |

OTHER PUBLICATIONS

K. Chen, et al., "A Low-Power Digit-Based Reconfigurable FIR Filter", IEEE Transactions on Circuits and Systems—11: Express Briefs, vol. 53, No. 8, pp. 617-621 (2006).
N. Guilar, et al., "A 200 MS/s Passive Switched-Capacitor FIR Equalizer using a Time-Interleaved Topology", IEEE 2005 Custom Integrated Circuits Conference, pp. 633-636 (2005).
H. Repo, et al., "Programmable switched capacitor 4-tap FIR filter", European Solid-State Circuits, 2003, pp. 445-448 (2003).
Bagheri et al.; "An 800MHz to 5GHz Software-Defined Radio Receiver in 90nm CMOS", IEEE Int. Solid State Circuits Conf. Dig. Tech. Papers, 10 pages, (2006).
R. Bagheri et al., "An 800 MHz to 5 GHz Software-Defined Radio Receiver in 90 nm CMOS," in IEEE International Solid-State Circuits Conference, Digest of Technical Papers, pp. 480-481 (2006).
Official Communication from Japanese Patent Office, dated Apr. 13, 2010, issued in counterpart JP Application No. 2007-304984 (3 pages).
Repo, H., et al., Programmable switched capacitor 4-tap FIR filter, Solid-State Circuits Conference, Sep. 16, 2003. ESSCIRC '03. Proceedings of the 29th European, p. 445-448.
Official communication from Chinese Patent Office, dated Apr. 21, 2010, issued in counterpart CN Application No. 200810177699.3 (3 pages).

* cited by examiner

*Primary Examiner* — Lincoln Donovan
*Assistant Examiner* — Shikha Goyal
(74) *Attorney, Agent, or Firm* — Finnegan, Henderson, Farabow, Garrett & Dunner, L.L.P.

(57) ABSTRACT

A charge domain filter circuit includes a first signal output portion, a second signal output portion, and an adder portion. The first signal output portion outputs a first signal that is sampled at a specified time interval. The second signal output portion outputs a second signal that is sampled at the same time interval as the first signal and at a different time. The adder portion adds the first signal and the second signal together and outputs the result. The second signal output portion is capable of selecting the time to sample the second signal from among a plurality of times.

3 Claims, 23 Drawing Sheets

CHARGE DOMAIN FILTER CIRCUIT

CROSS REFERENCES TO RELATED APPLICATIONS

The present invention contains subjected matter related to Japanese Patent Application JP 2007-304984 filed in the Japan Patent Office on Nov. 26, 2007, the entire contents of which being incorporated herein by reference.

BACKGROUND OF THE INVENTION

1. Field of the Invention

The present invention relates to a charge domain filter circuit.

2. Description of the Related Art

The miniaturization of the complementary metal oxide semiconductor (CMOS) process has the disadvantage that using known circuit technology to implement the RF circuit to reduce the power supply voltage reduces the dynamic range of the signal amplitude, because there is little voltage allowance. On the other hand, because miniaturization raises the cutoff frequency of the transistor, it is suitable for operations such as high-speed switching that must be performed with precise timing. Another advantage is that, because the lithography is performed with high precision, the capacitance ratios of capacitors can be specified accurately.

Digital RF technology is a technology that resolves the disadvantages that the miniaturization of the CMOS process engenders for the RF circuit and converts them to advantages. The main circuit in a discrete time receiver (DTR), in which digital RF technology is used for the receiver, is a charge domain filter. The charge domain filter includes a capacitor that accumulates and discharges a charge on a specified cycle. In the charge domain filter circuit, the filter is configured from only a transconductor and a switch, so it is capable of directly sampling and filtering RF signals in the gigahertz band.

It has been proposed that the filter characteristics of the charge domain filter can be made reconfigurable by varying the frequencies and waveforms of the filter's clock signals (refer to R. Bagheri et al., "An 800 MHz to 5 GHz Software-Defined Radio Receiver in 90 nm CMOS," in IEEE Int. Solid State Circuits Conf. Dig. Tech. Papers, February 2006, pp. 480-481). FIG. 20 is an explanatory figure that shows a known charge domain filter circuit, proposed by Bagheri et al., that has reconfigurable filter characteristics. FIGS. 21A, 21B and 21C are explanatory figures that show waveforms of clock signals that are input to a charge domain filter circuit 10 in FIG. 20. The clock signals shown in FIGS. 21A, 21B and 21C are respectively input to the various switches shown in the charge domain filter circuit 10 in FIG. 20. Each switch is on when the corresponding clock signal (indicated by the characters next to the switch) is high.

The charge domain filter circuit 10 shown in FIG. 20 is a sinc filter that is capable of switching its decimation ratio to 2 and 3. The charge domain filter circuit 10 shown in FIG. 20 operates such that the decimation ratio becomes 2 when the clock signals shown in FIG. 21B are input, and the decimation ratio becomes 3 when the clock signals shown in FIG. 21C are input. The charge domain filter circuit 10 thus has reconfigurable filter characteristics.

The operation of the charge domain filter circuit 10 will be explained. Four capacitors in the charge domain filter circuit 10 accumulate and discharge charges in temporal order. Taking a capacitor $C_1$ as an example, when a clock signal $\Psi_{1,r}$ becomes high, the two terminals of the capacitor $C_1$ are short-circuited and the charge is reset. When a clock signal $\Psi_1$ becomes high, a charge is accumulated from the input terminal. When a clock signal $K_1$ becomes high, the charge is discharged from the capacitor $C_1$ to the output terminal.

In a case where the decimation ratio is 2, an operation is repeated in which the charges of capacitors $C_1$ and $C_2$ are discharged simultaneously by clock signals $K_1$ and $K_2$, and the charges of capacitors $C_3$ and $C_4$ are discharged simultaneously by clock signals $K_3$ and $K_4$. The clock signals $K_1$ to $K_4$ therefore become repetitions of simple rectangular waves, as shown in FIG. 21B.

In contrast, in a case where the decimation ratio is 3, when the clock signal $\Psi_1$ becomes high, the charges of the capacitors $C_2$, $C_3$, and $C_4$ are discharged simultaneously by clock signals $K_2$, $K_3$, and $K_4$. When a clock signal $\Psi_4$ becomes high, the charges of the capacitors $C_1$, $C_2$, and $C_3$ are discharged simultaneously by clock signals $K_1$, $K_2$, and $K_3$. When a clock signal $\Psi_3$ becomes high, the charges of the capacitors $C_1$, $C_2$, and $C_4$ are discharged simultaneously by clock signals $K_1$, $K_2$, and $K_4$. When a clock signal $\Psi_2$ becomes high, the charges of the capacitors $C_1$, $C_3$, and $C_4$ are discharged simultaneously by clock signals $K_1$, $K_3$, and $K_4$. The clock signals $K_1$ to $K_4$ therefore become repetitions of irregular rectangular waves with long cycles, as shown in FIG. 21C.

SUMMARY OF THE INVENTION

The clock signals shown in FIGS. 21A to 21C that are input to the charge domain filter circuit 10 have a completely different waveform from the signals in FIGS. 21B and 21C. In particular, the clock signal in FIG. 21C has a longer cycle. A read only memory (ROM) or a logic circuit such as a multi-stage shift register or the like is therefore necessary in order to generate this sort of clock signal. For example, in a case where the clock signal is operated at a high speed on the order of gigahertz, an increase in the amount of electric current consumed in the logic circuit leads to an increase in the amount of electric power consumed. Further, if the cycle of the clock signal is long, the low-frequency spectrum is included in the signal, which tends to cause a problem in which the clock signal spectrum is mixed into the passband of the charge domain filter, impeding reception when the charge domain filter circuit is used in a receiver.

The present invention addresses these issues and provides a charge domain filter circuit that is new and improved, has reconfigurable filter characteristics, and is capable of operating with low power consumption.

In order to address the issues described above, according to an embodiment of the present invention, there is provided a charge domain filter circuit that includes a first signal output portion, a second signal output portion, and an adder portion. The first signal output portion outputs a first signal that is sampled at a specified time interval. The second signal output portion outputs a second signal that is sampled at the same time interval as the first signal and at a different time. The adder portion adds the first signal and the second signal together and outputs the result. The second signal output portion is capable of selecting the time to sample the second signal from among a plurality of times.

According to this configuration, the first signal output portion outputs the first signal that is sampled at the specified time interval, the second signal output portion outputs the second signal that is sampled at the same time interval as the first signal and at the different time, and the adder portion adds together the first signal that is output by the first signal output portion and the second signal that is output by the second signal output portion and outputs the result. In addition, the second signal output portion is capable of selecting the time to sample the second signal from among a plurality of times. This makes it possible to provide a charge domain filter circuit that is capable of operating with low power consumption and in which the frequency characteristics can be reconfigured by selecting the time to sample the second signal from among the plurality of times.

The charge domain circuit may also include a clock signal generation portion that generates a plurality of clock signals that are input to the second signal output portion. The second signal output portion may be capable of selecting the time to sample the second signal by selecting and inputting one of the clock signals that is generated by the clock signal generation portion. This makes it possible to provide a charge domain filter circuit that is capable of selecting the time to sample the second signal by switching the clock signal that is input to the second signal output portion, and thus is capable of changing the frequency characteristics by switching the clock signal.

The specified time interval may also be variable. Varying the time interval at which the sampling is performed makes it possible to vary the frequency characteristics.

According to the embodiments of the present invention described above, a charge domain filter circuit can be provided that is new and improved, that is capable of operating with low power consumption, and in which the frequency characteristics can be reconfigured.

DETAILED DESCRIPTION OF THE PREFERRED EMBODIMENTS

Figure 1:
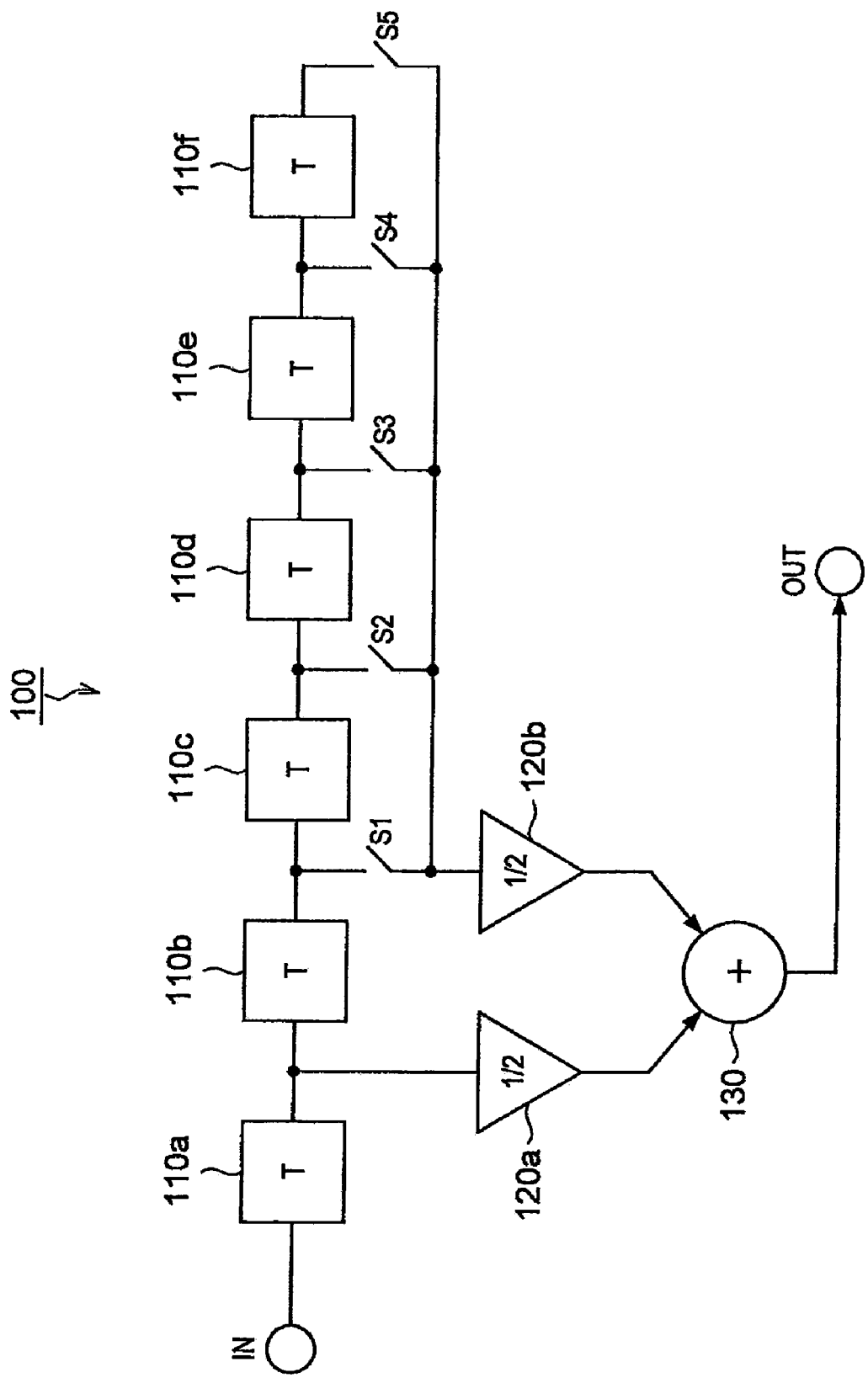
FIG. 1 is an explanatory figure that shows a configuration of a charge domain filter circuit 100 according to a first embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment

First, a charge domain filter circuit according to a first embodiment of the present invention will be explained. FIG. 1 is an explanatory figure that uses a block diagram to explain a configuration of a charge domain filter circuit 100 according to the first embodiment of the present invention. The charge domain filter circuit 100 according to the first embodiment of the present invention will be explained below using FIG. 1.

As shown in FIG. 1, the charge domain filter circuit 100 according to the first embodiment of the present invention is an example of a finite impulse response (FIR) filter and is configured such that it includes delay registers 110a, 110b, 110c, 110d, 110e, 110f, switches S1, S2, S3, S4, S5, multipliers 120a, 120b, and an adder 130.

A discrete-time signal that is sampled from a continuous-time signal at a sampling interval T is input from an input terminal IN to the charge domain filter circuit 100. The sampling frequency is expressed as $f_s$ (1/T). The delay registers 110a, 110b, 110c, 110d, 110e, 110f each output the sampled input signal after delaying for the time T from the time when the input signal was sampled. The output from the delay register 110a is input to the multiplier 120a. Only one of the outputs from the delay registers 110b to 110f is selected, as described later, and is input to the multiplier 120b. Note that the sampling interval T is a variable value that can be set as desired. The sampling interval T may also be varied in order to obtain the desired frequency characteristics.

Only one of the switches S1, S2, S3, S4, S5 is selected to change to an on state. Selecting only one of the switches S1, S2, S3, S4, S5 to change to the on state makes it possible to select only one of the outputs from the delay registers 110b to 110f to be output to the multiplier 120b.

The multiplier 120a halves the output from the delay register 110a and outputs it. The multiplier 120b halves the output from the selected one of the delay registers 110b to 110f and outputs it. The outputs from the multipliers 120a, 120b are input to the adder 130. The adder 130 inputs the outputs from the multipliers 120a, 120b, adds the two inputs together, and outputs the sum.

A transfer function of the charge domain filter circuit 100 configured as shown in FIG. 1 is expressed by Equation 1 below.

$$H(z) = \frac{z^{-1} + z^{-n}}{2}$$  Equation 1

(Note that $n$ = 2, 3, 4, 5, 6.)

Figure 2:
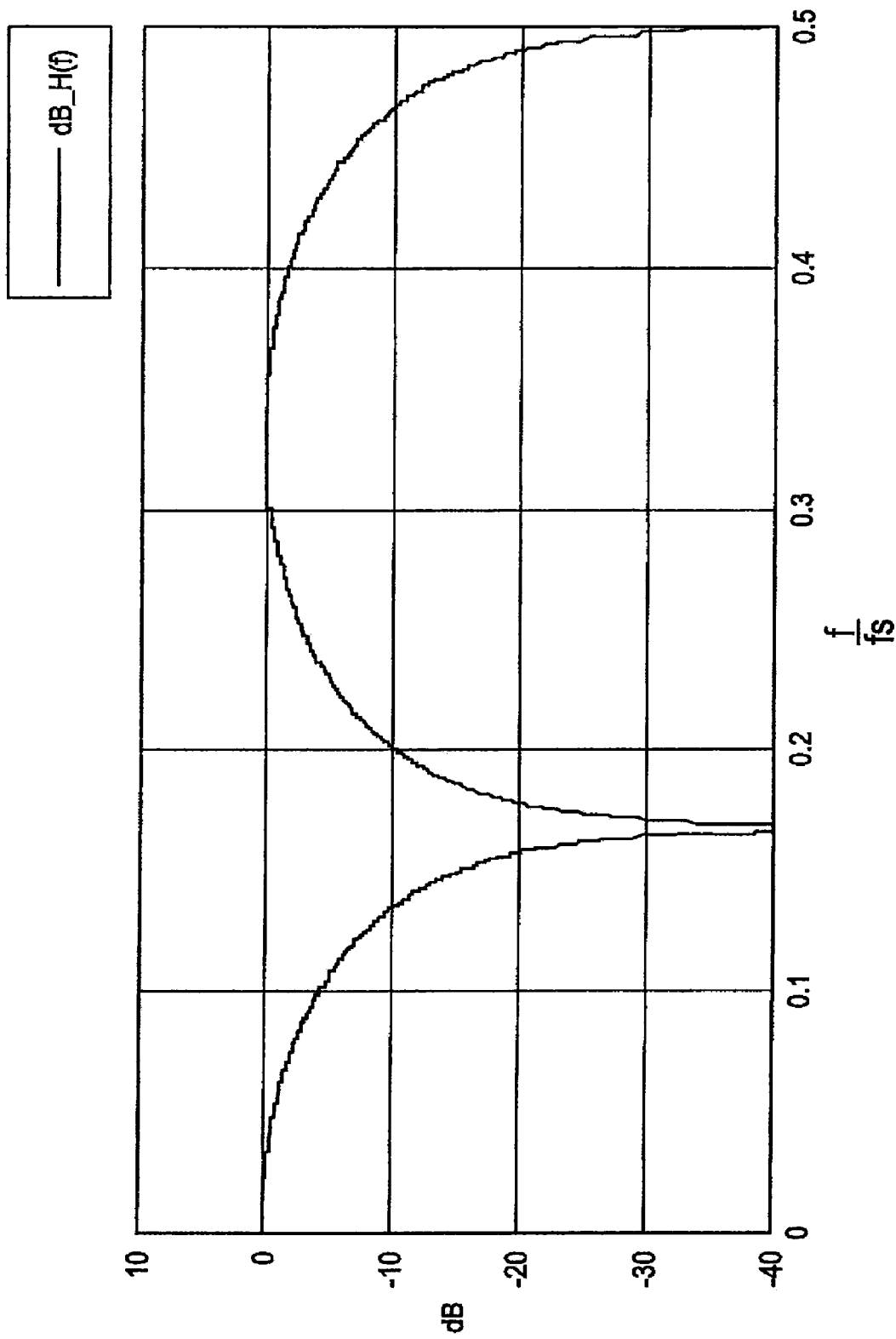
FIG. 2 is an explanatory figure that shows normalized frequency characteristics in a case where only a switch S3 is closed in the charge domain filter circuit 100 shown in FIG. 1.

For example, in a case where n=4, the charge domain filter circuit 100 enters a state in which only the switch S3 is closed. The normalized frequency characteristics in this case are shown in FIG. 2. In the graph shown in FIG. 2, the line indicated by dB_H(f) expresses the normalized frequency characteristics in the state in which only the switch S3 is closed. As shown in FIG. 2, in the case where n=4, it can be seen that notches form at the positions where the normalized frequency $f/f_s$, which is the signal frequency f divided by the sampling frequency $f_s$ is 0.167 (⅙) and 0.5.

In a case where a sinc filter is used and a notch forms at the position where the normalized frequency is ⅙, a transfer function such as that in Equation 2 is required.

$$H(z) = \frac{z^{-1} + z^{-2} + z^{-3} + z^{-4} + z^{-5} + z^{-6}}{6}$$  Equation 2

Figure 22:
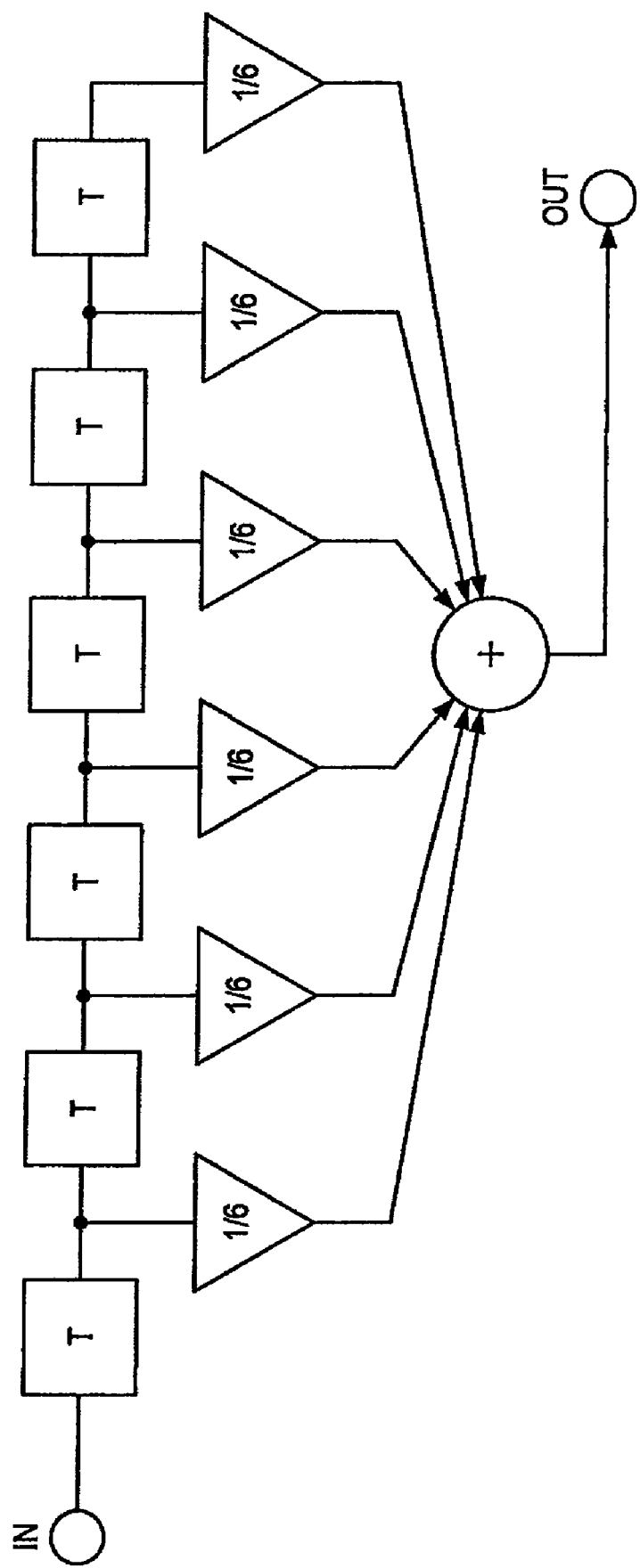
FIG. 22 is an explanatory figure that shows a block diagram of a sinc filter for implementing a transfer function shown by Equation 2.
Figure 23:
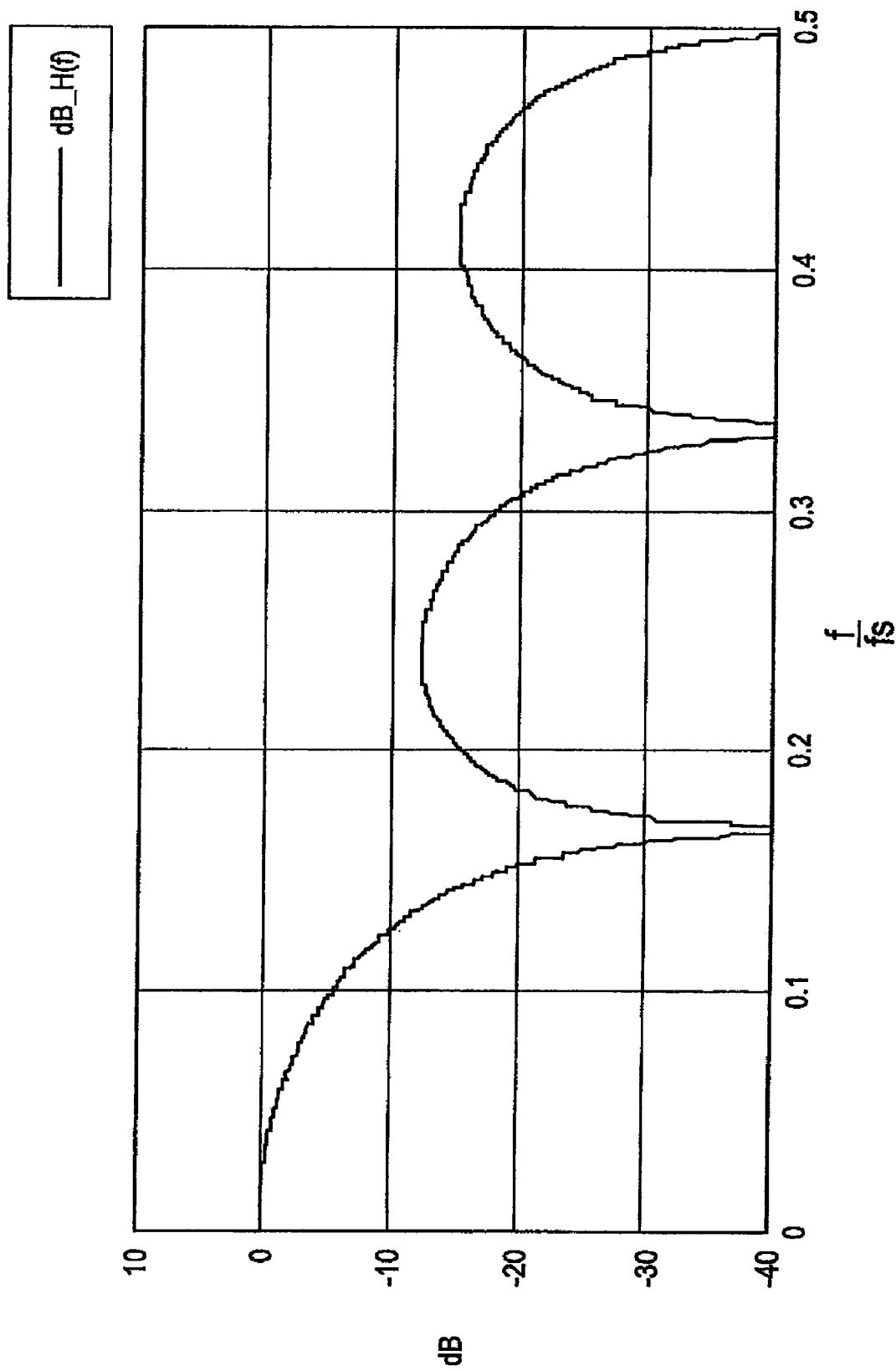
FIG. 23 is an explanatory figure that shows normalized frequency characteristics of the sinc filter shown in FIG. 22.

A block diagram of a sinc filter for implementing the transfer function shown by Equation 2 is shown in FIG. 22. The normalized frequency characteristics of the sinc filter shown in FIG. 22 are shown in FIG. 23. Comparing the normalized frequency characteristics in FIG. 2 and the normalized frequency characteristics in FIG. 23, it can be seen that both show the same frequency characteristics in the low frequency range up to the normalized frequency 0.167. However, a comparison of Equation 1 and Equation 2 shows that unlike the sinc filter transfer function shown by Equation 2, which requires that six samples with six different delay times be added together, the transfer function of the charge domain filter circuit 100 shown by Equation 1 requires only two samples to be added together. Further, in the low frequency range up to the normalized frequency 0.167, the charge domain filter circuit 100 shown in FIG. 1 has the advantage that it can achieve the same frequency characteristics as the sinc filter shown in FIG. 22 with a configuration that has fewer elements than the sinc filter shown in FIG. 22.

Figure 3:
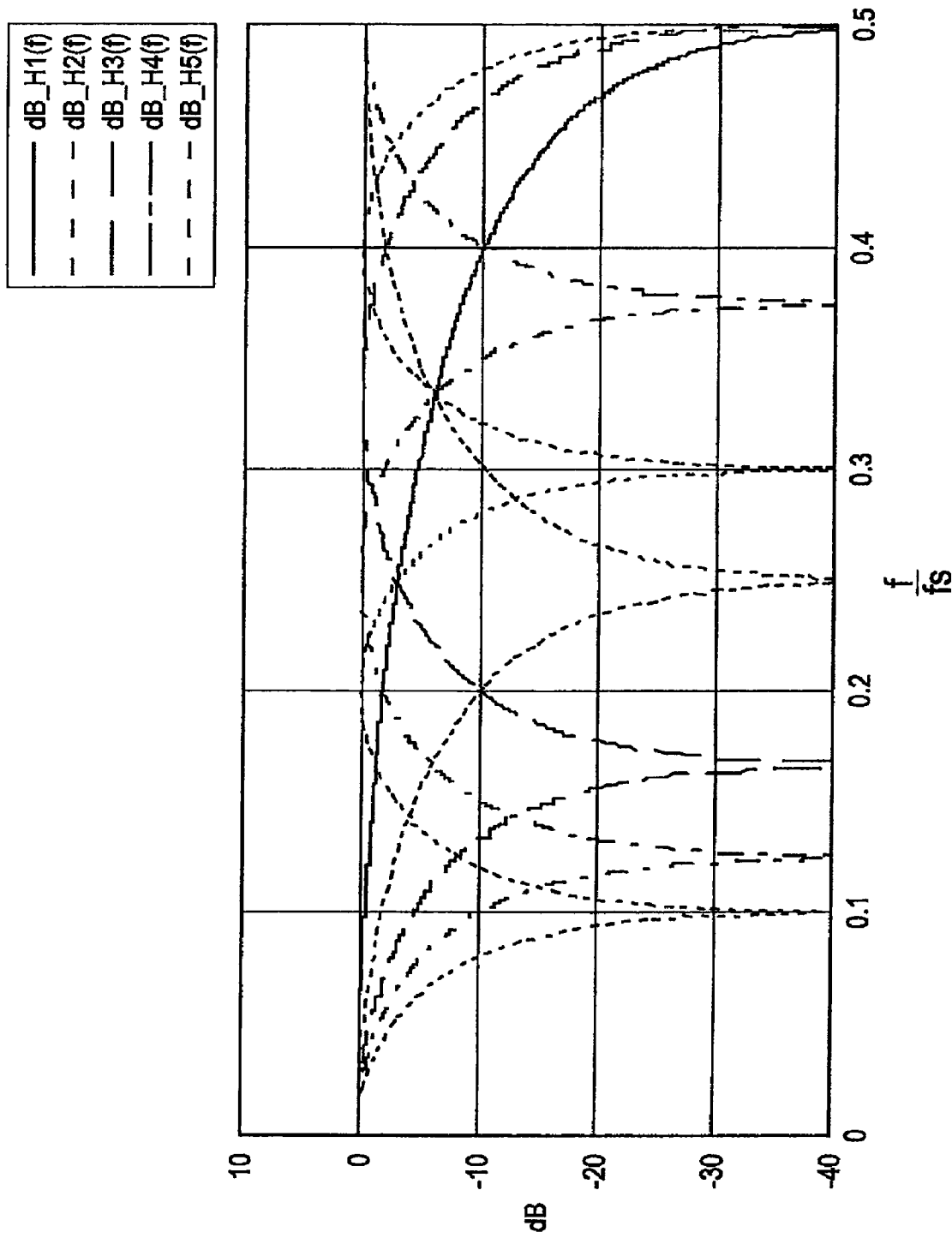
FIG. 3 is an explanatory figure that shows changes of positions of notches in the normalized frequency characteristics in the charge domain filter circuit 100.

In addition, the positions of the notches in the normalized frequency characteristics for the charge domain filter circuit 100 shown in FIG. 1 correspond to the zero point of the transfer function, giving the charge domain filter circuit 100 the advantage of being able to vary the positions of the notches in the normalized frequency characteristics by changing the value of n in Equation 1, that is, by turning on only one of the switches S1 to S5. FIG. 3 is an explanatory figure that shows how the positions of the notches in the normalized frequency characteristics in the charge domain filter circuit 100 are varied by changing the value of n. In FIG. 3, dB_H1(f) shows the characteristics when n=2, dB_H2(f) shows the characteristics when n=3, dB_H3(f) shows the characteristics when n=4, dB_H4(f) shows the characteristics when n=5, and dB_H5(f) shows the characteristics when n=6. As shown in FIG. 3, the positions of the notches in the normalized frequency characteristics can be varied by changing the value of n in Equation 1, that is, by turning on only one of the switches S1 to S5.

The charge domain filter circuit 100 according to the first embodiment of the present invention has been explained above. Next, an example of an implementation of the charge domain filter circuit 100 according to the first embodiment of the present invention will be explained.

Figure 4:
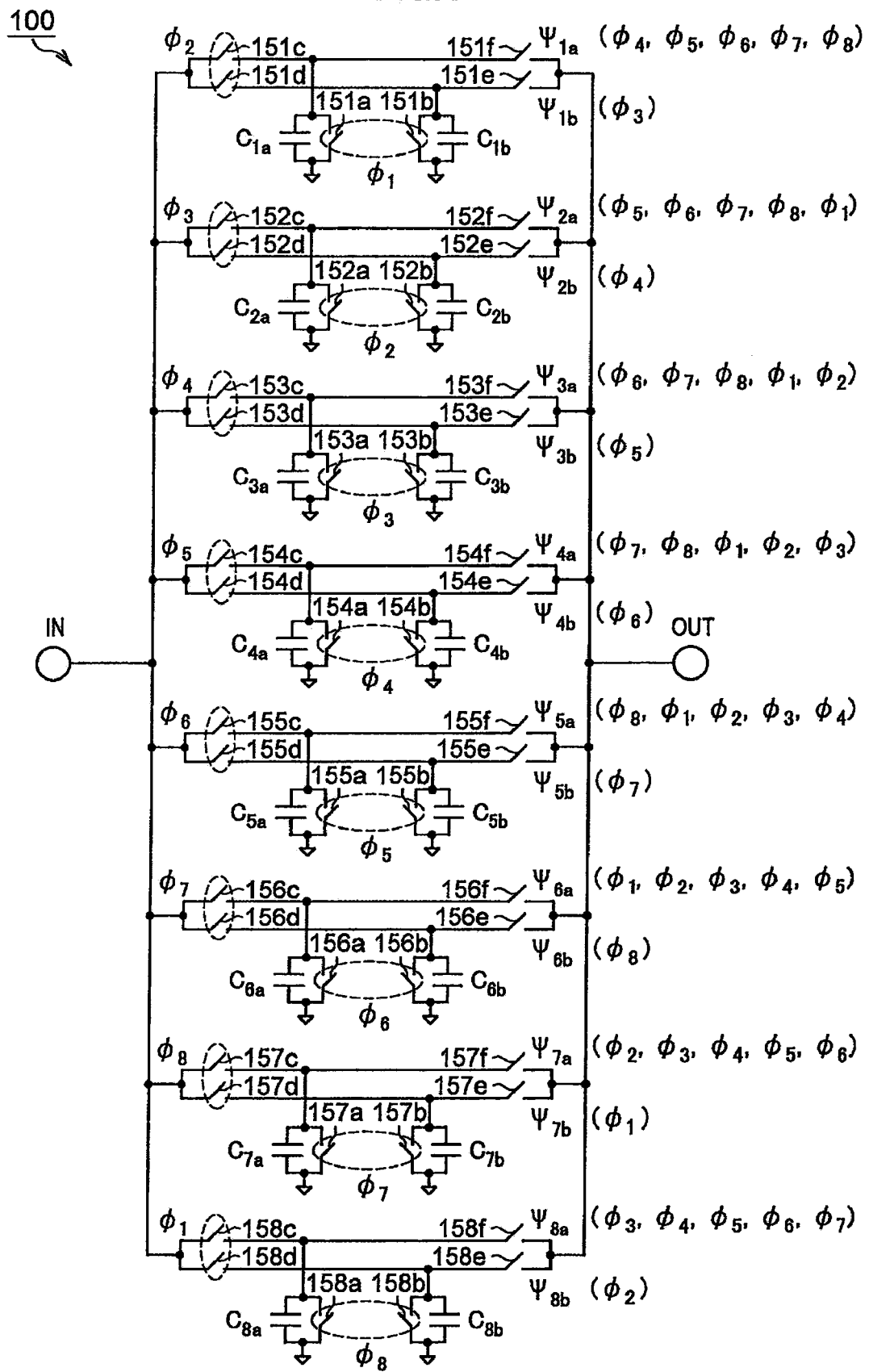
FIG. 4 is an explanatory figure that shows an example of a circuit in a case where the charge domain filter circuit 100 according to the first embodiment of the present invention is implemented as an actual circuit.

FIG. 4 is an explanatory figure that shows an example of a circuit in a case where the charge domain filter circuit 100 according to the first embodiment of the present invention, shown in FIG. 1, is implemented as an actual circuit that is configured from switches and capacitors. The configuration of the charge domain filter circuit 100 according to the first embodiment of the present invention will be explained below with reference to FIG. 4.

As shown in FIG. 4, the charge domain filter circuit 100 according to the first embodiment of the present invention has an eight-tier configuration in which each tier includes six switches and two capacitors. A charge is repeatedly input to the capacitors from an input terminal IN, and a charge is repeatedly discharged from the capacitors to an output terminal OUT, by switching the switches shown in FIG. 4 as necessary.

Figure 5:
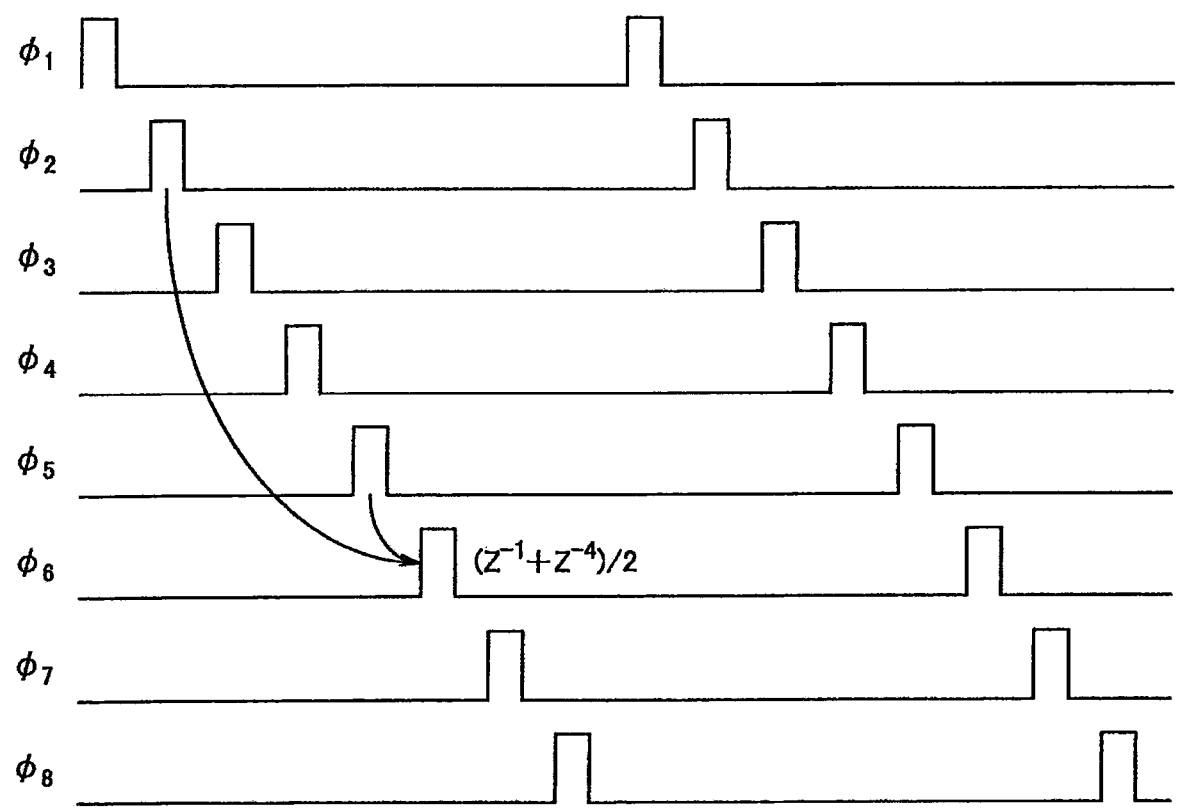
FIG. 5 is an explanatory figure that shows waveforms of clock signals that are input to the charge domain filter circuit 100 according to the first embodiment of the present invention that is shown in FIG. 4.

FIG. 5 is an explanatory figure that shows waveforms of clock signals that are input to the charge domain filter circuit 100 according to the first embodiment of the present invention that is shown in FIG. 4. In the clock signals shown in FIG. 5, the intervals between the rising edges of adjacent clock signals corresponds to the sampling interval T described above. The clock signals $\phi_1$ to $\phi_8$ in FIG. 5 respectively correspond to the symbols ($\phi_1$, $\phi_2$, $\phi_3$, $\phi_4$, $\phi_5$, $\phi_6$, $\phi_7$, $\phi_8$) for various switches in FIG. 4. When any one of the clock signals $\phi_1$ to $\phi_8$ in FIG. 5 becomes high, the switches shown in FIG. 4 that correspond to the clock signal become on. For example, when the clock signal $\phi_1$ becomes high, the switches 151a, 151b, 158c, and 158d in FIG. 4 become on. Therefore, repeatedly turning the clock signals $\phi_1$ to $\phi_8$ in FIG. 5 to high and low causes charges to be accumulated in the various capacitors shown in FIG. 4 and causes the signal sampling to be performed.

The symbol $\psi$ is used in FIG. 4 to indicate a switch that is turned on by one clock signal. For example, $\psi_{1a}$ ($\phi_4$, $\phi_5$, $\phi_6$, $\phi_7$, $\phi_8$) indicates that the switch 151f becomes on when any one of the clock signals $\phi_4$ to $\phi_8$ becomes high, and $\psi_{1b}$ ($\phi_3$) indicates that the switch 151g becomes on when the clock signal $\phi_3$ becomes high. Further, $\psi_{1a}$ to $\psi_{8a}$ indicate switches that become on when the clock signals that are shown in the corresponding positions become high. For example, in a case where the switch 151f becomes on when the clock signal $\phi_6$ becomes high, the switch 152f becomes on when the clock signal $\phi_7$ becomes high, and the switch 153f becomes on when the clock signal $\phi_8$ becomes high. Hereinafter, the same applies to all of the switches that are marked with the symbol $\psi$.

Figure 6:
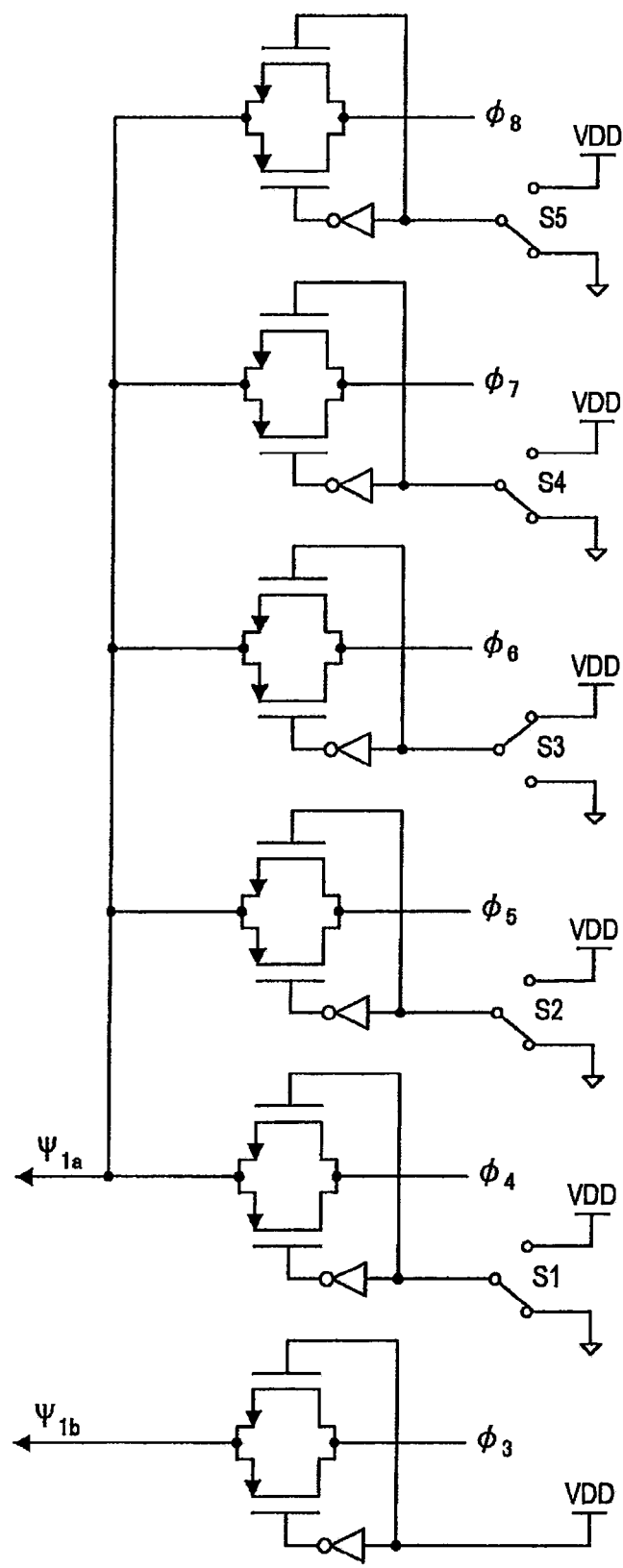
FIG. 6 is an explanatory figure that shows a circuit that selects the clock signal that is input to the charge domain filter circuit 100 according to the first embodiment of the present invention that is shown in FIG. 4.

FIG. 6 is an explanatory figure that shows a circuit that selects the clock signal that is input to the charge domain filter circuit 100 according to the first embodiment of the present invention that is shown in FIG. 4. As shown in FIG. 6, each of the switches for inputting the clock signal to the charge domain filter circuit 100 may be configured from a complementary metal oxide semiconductor (CMOS) transfer gate. Configuring each switch from a CMOS transfer gate makes it possible to align all the switches to the same delay time. The circuit in FIG. 6 is configured such that one of the clock signals for $\phi_{1a}$ becomes high and the switch 151f becomes on when any one of switches S1 to S5 is turned on. FIG. 6 illustrates a case where the switch S3 is turned on and the clock signal $\phi_6$ becomes high.

Note that it is preferable for each of the sixteen capacitors shown in FIG. 4 to have the same capacitance. One of a metal oxide field effect transistor (MOSFET) and a CMOSFET may also be used for each switch in the charge domain filter circuit 100 according to the first embodiment of the present invention that is shown in FIG. 4.

The charge domain filter circuit 100 that is shown in FIG. 4 is a filter with the same sampling rate for both input and output, making it possible to switch the notch positions of the normalized frequency characteristics in five different ways by switching the clock signals that are input. The configuration of the charge domain filter circuit 100 according to the first embodiment of the present invention has been explained above. Next, the operation of the charge domain filter circuit 100 according to the first embodiment of the present invention will be explained.

Focusing first on capacitors $C_{1a}$, $C_{1b}$, when the clock signal $\phi_1$ becomes high, the switches 151a, 151b both become on, grounding the capacitors $C_{1a}$, $C_{1b}$. The residual charges in the capacitors $C_{1a}$, $C_{1b}$ are therefore discharged, and the capacitors $C_{1a}$, $C_{1b}$ are reset. When the clock signal $\phi_2$ becomes high, the switches 151a, 151b both become off, and the switches 151c, 151d both become on, connecting the capacitors $C_{1a}$, $C_{1b}$ to the input terminal IN such that charges are accumulated in the capacitors $C_{1a}$, $C_{1b}$.

When the clock signal $\phi_3$ becomes high, the switches 151c, 151d both become off, and the switch 151e becomes on, causing the charge that is accumulated in the capacitor $C_{1b}$ to be output to the output terminal OUT. Further, when any one of the clock signals $\phi_4$ to $\phi_8$ becomes high, the switch 151f becomes on, causing the charge that is accumulated in the capacitor $C_{1a}$ to be output to the output terminal OUT. In this example, the switch 151f is turned on when the clock signal $\phi_6$ becomes high, and the charge that is accumulated in the capacitor $C_{1a}$ is output to the output terminal OUT.

The switch that becomes on only when the clock signal $\phi_6$ becomes high is the switch 154e. When the switch 154e becomes on, the charge in the capacitor $C_{4b}$ is output to the output terminal OUT. The charge is accumulated in the capacitor $C_{4b}$ when the clock signal $\phi_5$ becomes high at a time that is equivalent to one sampling cycle prior to the time when the clock signal $\phi_6$ becomes high.

In one sampling operation, the charges are accumulated in two capacitors that have the same capacitance, such that the transfer function for the capacitor $C_{4b}$ is $z^{-1}/2$, the transfer function for the capacitor $C_{1a}$ is $z^{-4}/2$. Therefore, when the clock signal $\phi_6$ becomes high, the charge that is accumulated in the capacitor $C_{1a}$ and the charge that is accumulated in the capacitor $C_{4b}$ are output to the output terminal OUT simultaneously, so this case is equivalent to the case where n=4 in Equation 1 above. The transfer function thus becomes the sum of the transfer function for the capacitor $C_{4b}$ and the transfer function for the capacitor $C_{1a}$, as shown in Equation 3 below.

$$H(z) = \frac{z^{-1} + z^{-4}}{2} \qquad \text{Equation 3}$$

Saying that this case is equivalent to the case where n=4 in Equation 1 above is equivalent to saying that the charge domain filter circuit 100 shown in FIG. 1 is in a state in which only the switch S3 is on. It can therefore be seen that the charge domain filter circuit 100 shown in FIG. 1 can be implemented by the circuit configuration of switches and capacitors that is shown in FIG. 4.

The accumulating and discharging of the charges is repeatedly performed in the same manner in each sampling cycle, even for the capacitors $C_{2a}$, $C_{2b}$ and the like, so the sampling rate is the same for both input and output. The circuit that is shown in FIG. 4, as the entire circuit, is equivalent to the state in which only the switch S3 is on in the charge domain filter circuit 100 shown in FIG. 1. Therefore, in the case where only the switch S3 is on, the normalized frequency characteristics for the charge domain filter circuit 100 shown in FIG. 4 have the same properties as the normalized frequency characteristics shown in FIG. 2.

The operation of the charge domain filter circuit 100 according to the first embodiment of the present invention has been explained above. As explained above, according to the first embodiment of the present invention, it is possible, by adding together only two charges, to achieve normalized frequency characteristics that are equivalent to those of a sinc filter that must add together a large number of charges. Further, the timing of the discharging of the charges can be controlled by controlling the output of the clock signals, which makes it easy to change the frequency characteristics. In addition, the clock signals that are input to the charge domain filter circuit 100 are short-cycle clock signals with identical waveforms and differ only in their phases, so the clock signals are easy to generate, and the amount of electric power that is consumed can be kept low even when the circuit is operated at high speed. Finally, the waveforms of the clock signals that are input to the charge domain filter circuit 100 are simple, rectangular waves with short cycles, and low-frequency components are not included in the clock signal spectrum. Therefore, even if the clock signal spectrum temporarily becomes mixed into the passband of the filter, it can be easily eliminated.

Second Embodiment

The charge domain filter circuit 100 that was explained in the first embodiment of the present invention can change the frequency characteristics by integrating two signals that are sampled at different times and switching the sampling timing of one of the signals. In a second embodiment of the present invention, a charge domain filter circuit will be explained that can change the frequency characteristics by integrating three signals that are sampled at different times.

Figure 7:
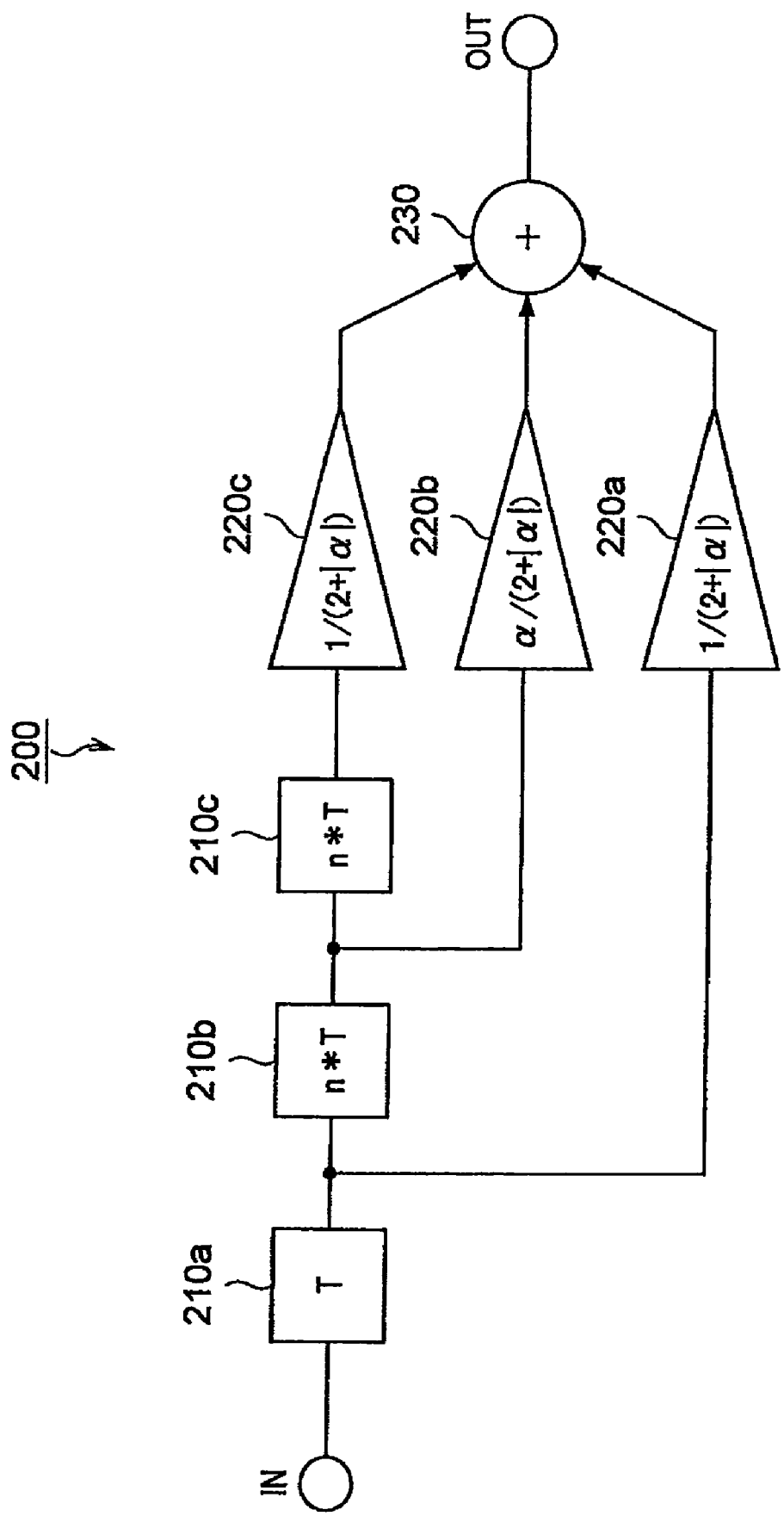
FIG. 7 is an explanatory figure that shows a configuration of a charge domain filter circuit 200 according to a second embodiment of the present invention.

FIG. 7 is an explanatory figure that uses a block diagram to explain a configuration of a charge domain filter circuit 200 according to the second embodiment of the present invention. The charge domain filter circuit 200 according to the second embodiment of the present invention will be explained below using FIG. 7.

As shown in FIG. 7, the charge domain filter circuit 200 according to the second embodiment of the present invention is an example of a FIR filter and is configured such that it includes delay registers 210a, 210b, 210c, multipliers 220a, 220b, 220c, and an adder 230.

In the same manner as in the charge domain filter circuit 100 according to the first embodiment of the present invention, a discrete-time signal that is sampled from a continuous-time signal at a sampling interval T is input to the charge domain filter circuit 200 from an input terminal IN. In the same way, the sampling frequency is expressed as $f_s$ (1/T). The delay register 210a outputs the sampled input signal after delaying for the time T from the time when the input signal was sampled. The signal that is output from the delay register 210a is input to the delay register 210b and the multiplier 220a. Note that the sampling interval T is a variable value that can be set as desired. The sampling interval T may also be varied in order to obtain the desired frequency characteristics.

After delaying for a time n×T (n times T, where n is an integer of 1 or greater), the delay register 210b outputs the signal that was output from the delay register 210a. That is, the output signal from the delay register 210b is a signal that is delayed for T (n+1) from the time when the signal was sampled. The output signal from the delay register 210b is input to the delay register 210c and the multiplier 220b. After delaying for an additional time n×T, the delay register 210c outputs the signal that was output from the delay register 210b. That is, the output signal from the delay register 210c is a signal that is delayed for T (2n+1) from the time when the signal was sampled. The output signal from the delay register 210c is input to the multiplier 220c.

The multiplier 220a multiplies the signal that was output from the delay register 210a by 1/(2+|a|) and outputs the result. In the same manner, the multiplier 220b multiplies the signal that was output from the delay register 210b by a/(2+|a|) and outputs the result, and the multiplier 220c multiplies the signal that was output from the delay register 210c by 1/(2+|a|) and outputs the result. The adder 230 adds together the output signals from the multipliers 220a, 220b, 220c and outputs the result.

Note that the reason for treating the value of a as an absolute value is that a negative value can be obtained for a. Specifically, the value of a can be made a negative value by differentiating the charge domain filter circuit 200 shown in FIG. 7 and inputting a reverse phase signal to the delay register 210b.

In this case, a satisfies Equation 4 below.

$$\alpha = -2\cos(n\theta) \quad \text{Equation 4}$$

where $$\theta = \frac{2\pi \cdot frel}{4n}$$

Here, frel is the relative frequency when the lowest frequency at which a notch is formed is 1.0 in a case where a is zero. This means that the transfer function of the charge domain filter circuit 200 shown in FIG. 7 is as shown in Equation 5 below.

$$H(z) = \frac{z^{-1} + \alpha z^{-(n+1)} + z^{-(2n+1)}}{2 + |\alpha|} \quad \text{Equation 5}$$

For example, in a case where the coefficient a is set to zero when n=1, Equation 5 above becomes Equation 6 below.

$$H(z) = \frac{z^{-1} + z^{-3}}{2} \quad \text{Equation 6}$$

Figure 8:
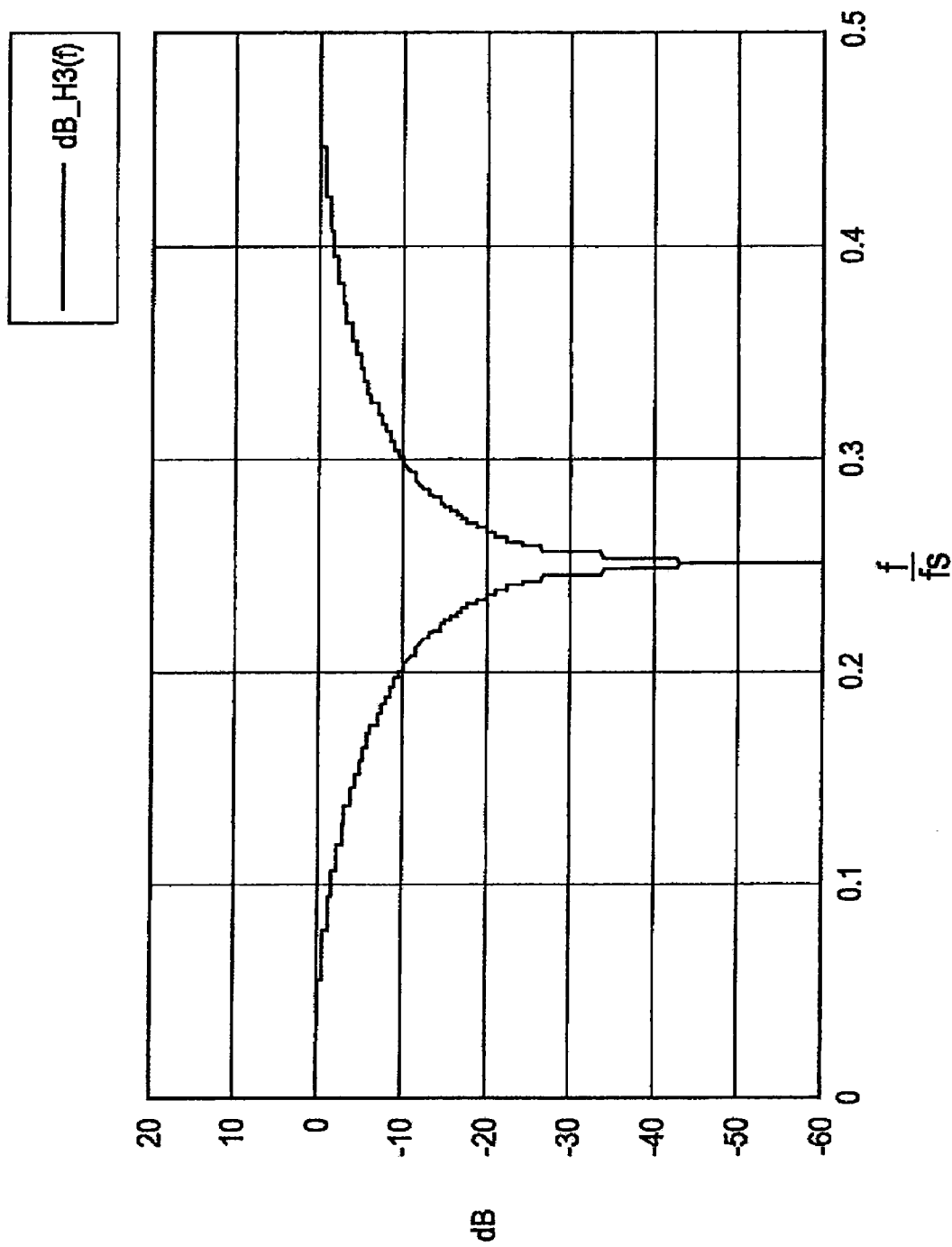
FIG. 8 is an explanatory figure that shows an example of normalized frequency characteristics of the charge domain filter circuit 200 shown in FIG. 7.

The frequency characteristics as normalized by the sampling frequency $f_s$ are shown in FIG. 8 for the case where the coefficient a is set to zero in Equation 5 when n=1. The line indicated by dB_H3(f) in FIG. 8 indicates the frequency characteristics in this case. As shown in FIG. 8, in the case where the coefficient a is set to zero when n=1, it can be seen that a notch forms where the normalized frequency $f/f_s$ is 0.25 (¼). When the coefficient a is zero, the output from the multiplier 220b is also zero, which makes the charge domain filter circuit 200 a charge domain filter that integrates and outputs two signals. When two signals are integrated and output, the frequency at which the notch position forms (the notch frequency) is limited to a frequency at which the integer portion of the sampling frequency is 1.

Next, a case will be considered in which the notch frequency is raised by twenty percent. In order to raise the notch frequency by twenty percent, a is derived with the value of frel set to 1.2 in Equation 4. (The value of n is unchanged at 1.) This yields a value for a of 0.618. The transfer function for the charge domain filter circuit 200 when the value of a is 0.618 is shown in Equation 7 below.

$$H(z) = \frac{z^{-1} + 0.618 z^{-(n+1)} + z^{-(2n+1)}}{2.618} \quad \text{Equation 7}$$

Figure 9:
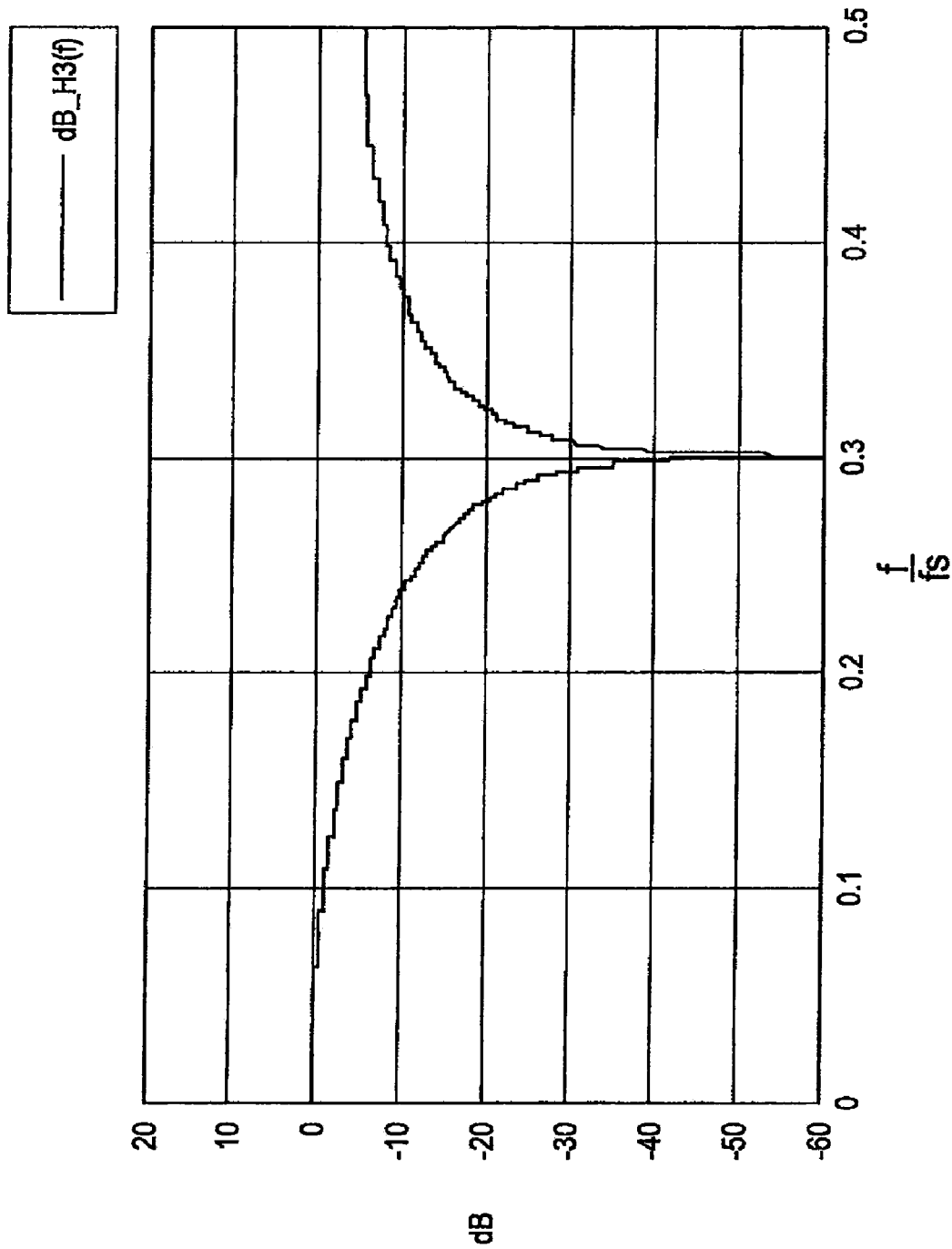
FIG. 9 is an explanatory figure that shows another example of the normalized frequency characteristics of the charge domain filter circuit 200 shown in FIG. 7.

In this case, the frequency characteristics as normalized by the sampling frequency $f_s$ are shown in FIG. 9. The line indicated by dB_H3(f) in FIG. 9 indicates the frequency characteristics in this case. It can be seen that the position of the notch frequency (0.3) is twenty percent higher than in FIG. 8.

Note that it can be understood from Equation 4 above that the value that can be obtained for a is in the range from −2 to 2. Changing the value of a within this range makes it possible to vary the notch frequency without being limited by the sampling frequency $f_s$.

The charge domain filter circuit 200 according to the second embodiment of the present invention has been explained above. Next, an example of a configuration of the charge domain filter circuit 200 according to the second embodiment of the present invention will be explained.

Figure 10:
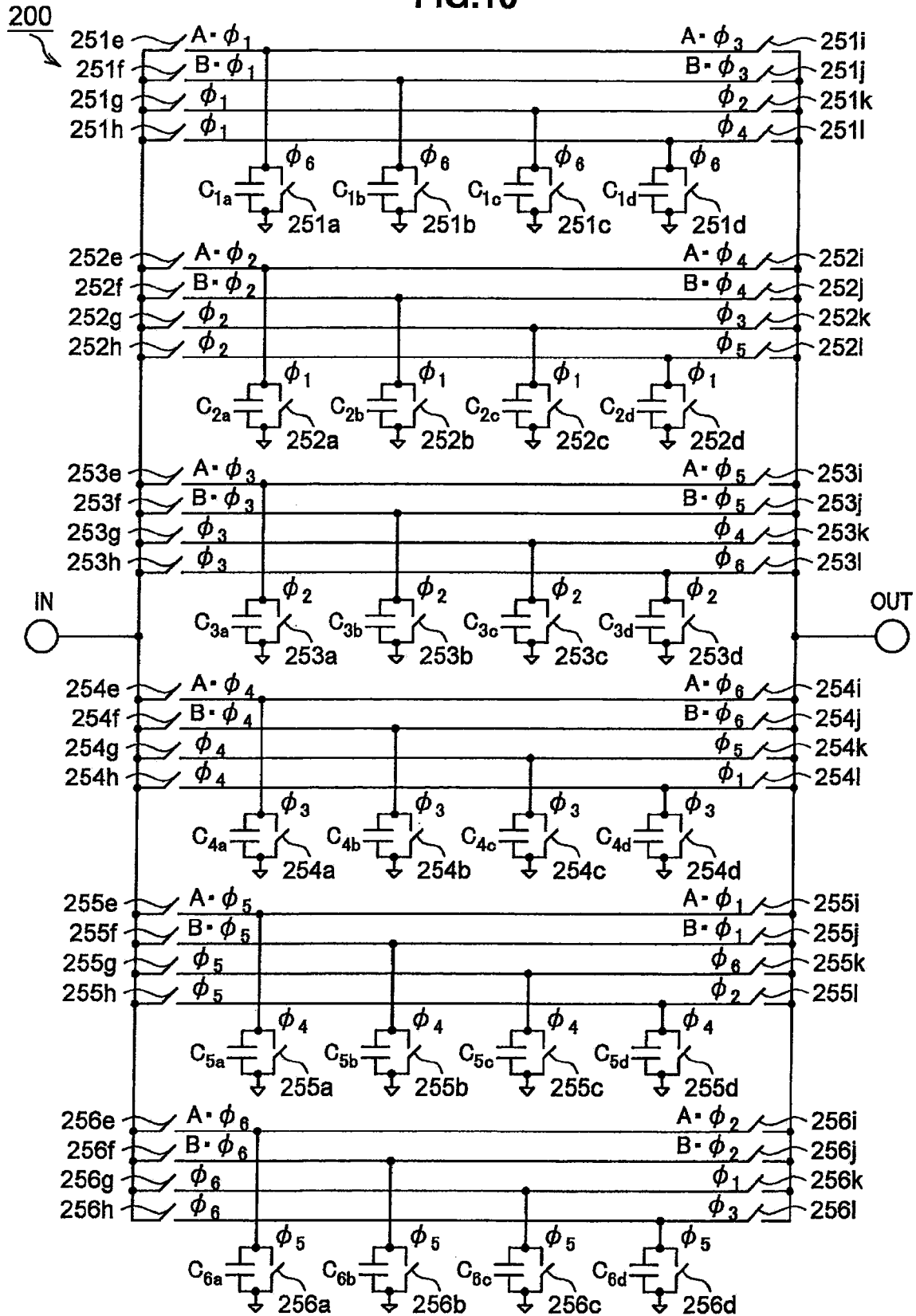
FIG. 10 is an explanatory figure that shows an example of a circuit in a case where the charge domain filter circuit 200 according to the second embodiment of the present invention is implemented as an actual circuit.

FIG. 10 is an explanatory figure that shows an example of a circuit in a case where the charge domain filter circuit 200 according to the second embodiment of the present invention shown in FIG. 7 is implemented as an actual circuit that is configured from switches and capacitors. The configuration of the charge domain filter circuit 200 according to the second embodiment of the present invention will be explained below with reference to FIG. 10.

The charge domain filter circuit 200 that is shown in FIG. 10 is an example of a configuration in the form of an actual circuit that is configured from switches and capacitors, with the value of n in the configuration shown in FIG. 7 set to 1. As shown in FIG. 10, the charge domain filter circuit 200 according to the second embodiment of the present invention has a six-tier configuration in which each tier includes twelve switches and four capacitors. A charge is repeatedly input to the capacitors from an input terminal IN, and a charge is repeatedly discharged from the capacitors to an output terminal OUT, by switching the individual switches as necessary.

Figure 11:
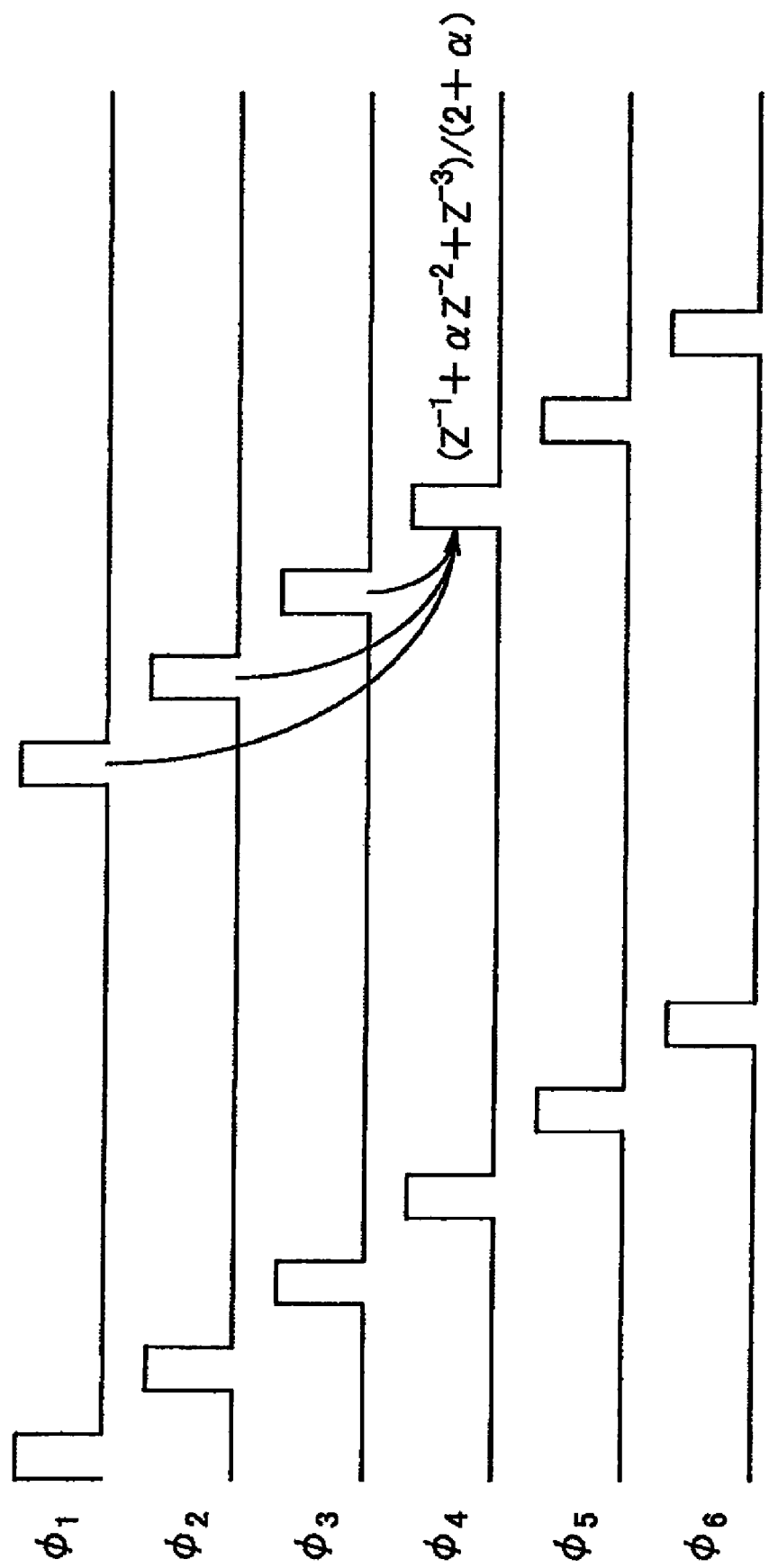
FIG. 11 is an explanatory figure that shows waveforms of clock signals that are input to the charge domain filter circuit 200 according to the second embodiment of the present invention, shown in FIG. 10.

FIG. 11 is an explanatory figure that shows waveforms of clock signals that are input to the charge domain filter circuit 200 according to the second embodiment of the present invention that is shown in FIG. 10. In the clock signals shown in FIG. 11, the intervals between the rising edges of adjacent clock signals corresponds to the sampling interval T described above. The clock signals $\phi_1$ to $\phi_6$ in FIG. 11 respectively correspond to the symbols ($\phi_1$, $\phi_2$, $\phi_3$, $\phi_4$, $\phi_5$, $\phi_6$) for various switches in FIG. 10. In the same manner as in the first embodiment of the present invention, when any one of the clock signals $\phi_1$ to $\phi_6$ in FIG. 11 becomes high, the switches shown in FIG. 10 that correspond to the clock signal become on. Therefore, repeatedly turning the clock signals $\phi_1$ to $\phi_6$ in FIG. 11 to high and low causes charges to be accumulated in the various capacitors shown in FIG. 10 and causes the signal sampling to be performed.

The letters A and B are also placed next to some of the switches in addition to the symbols that are used for the switches and that correspond to the clock signals. For example, the label A·$\phi_1$ for the switch 251e indicates that clock gating is performed for the clock signal $\phi_1$ by a control logic A. Specifically, if the control logic A is 1, the switch 251e turns on and off according to whether the clock signal $\phi_1$ is in a high or a low state, and if the control logic A is zero, the switch 251e is off, regardless of whether the clock signal $\phi_1$ is in a high or a low state.

Note that for the twenty-four capacitors shown in FIG. 10, it is preferable for all of the vertically aligned capacitors to have the same capacitance. For example, it is preferable for all of the capacitors $C_{1a}$, $C_{2a}$, $C_{3a}$, $C_{4a}$, $C_{5a}$, $C_{6a}$ to have the same capacitance. It is also preferable for the c and d capacitors within each tier, the capacitors $C_{1c}$ and $C_{1d}$, the capacitors $C_{2c}$ and $C_{2d}$, the capacitors $C_{3c}$ and $C_{3d}$, the capacitors $C_{4c}$ and $C_{4d}$, the capacitors $C_{5c}$ and $C_{5d}$, and the capacitors $C_{6c}$ and $C_{6d}$, to have the same capacitance. Taking the first tier as an example, the value of a in Equation 5 above can be determined by normalizing the capacitances of the capacitors $C_{1a}$ and $C_{1b}$ by the capacitance of the capacitor $C_{1c}$.

In the same manner as in the first embodiment of the present invention, one of a MOSFET and a CMOSFET may be used for each switch in the charge domain filter circuit 200 according to the second embodiment of the present invention that is shown in FIG. 10.

In the same manner as the charge domain filter circuit 100 according to the first embodiment of the present invention that is shown in FIG. 4, the charge domain filter circuit 200 that is shown in FIG. 10 is a filter with the same sampling rate for both input and output. The charge domain filter circuit 200 is also capable of switching the notch positions of the normalized frequency characteristics according to the capacitances of the capacitors and the states of the control logics A, B. The configuration of the charge domain filter circuit 200 according to the second embodiment of the present invention has been explained above. Next, the operation of the charge domain filter circuit 200 according to the second embodiment of the present invention will be explained.

Focusing first on capacitors $C_{2a}$, $C_{2b}$, $C_{2c}$, $C_{2d}$, when the clock signal $\phi_1$ becomes high, the switches 252a, 252b, 252c, 252d all become on, grounding the capacitors $C_{2a}$, $C_{2b}$, $C_{2c}$, $C_{2d}$. The residual charges in the capacitors $C_{2a}$, $C_{2b}$, $C_{2c}$, $C_{2d}$ are therefore discharged, and the capacitors $C_{2a}$, $C_{2b}$, $C_{2c}$, $C_{2d}$ are reset.

When the clock signal $\phi_2$ becomes high, the switches 252a, 252b, 252c, 252d all become off, and the switches 252g, 252h both become on, connecting the capacitors $C_{2c}$, $C_{2d}$ to the input terminal IN such that charges are accumulated in the capacitors $C_{2c}$, $C_{2d}$. Whether the switches 252e, 252f become on or not is determined by the states of the control logics A, B. The states of the control logics A, B also determine whether or not charges are accumulated in the capacitors $C_{2a}$, $C_{2b}$. To make the explanation easier to understand, the present example will be explained with the control logics A, B both set to 1. In a case where the control logics A, B are both 1, when the clock signal $\phi_2$ becomes high, the switches 252e, 252f become on, such that the capacitors $C_{2a}$, $C_{2b}$ are connected to the input terminal IN and charges are accumulated in the capacitors $C_{2a}$, $C_{2b}$.

When the clock signal $\phi_3$ becomes high, the switches 252e, 252f, 252g, 252h all become off, and the switch 252k becomes on, causing the charge that is stored in the capacitor $C_{2c}$ to be output to the output terminal OUT. Other switches that also become on when the clock signal $\phi_3$ becomes high are the switches 251i, 251j and 256l. Accordingly, when the clock signal $\phi_3$ becomes high, the charges that are stored in the capacitors $C_{1a}$, $C_{1b}$, $C_{6d}$ are also output to the output terminal OUT. The charges that are stored in the capacitors $C_{1a}$, $C_{1b}$ were accumulated when the clock signal $\phi_1$ became high, two sampling cycles before the clock signal $\phi_3$. The charge that is stored in the capacitor $C_{6d}$ was accumulated when the clock signal $\phi_6$ became high, three sampling cycles before the clock signal $\phi_3$.

The accumulating and discharging of the charges is repeatedly performed in the same manner in each sampling cycle, even for the capacitors in the other tiers, so the sampling rate is the same for both input and output.

Next, the capacitance ratios of the capacitors in each of the tiers will be explained using a. For example, the ratio of the sum of the capacitances of the capacitors $C_{1a}$ and $C_{1b}$ to the capacitance of the capacitor $C_{1c}$ may be a:1. In that case, because it is preferable for the capacitance of the capacitor $C_{1c}$ and the capacitance of the capacitor $C_{1d}$ to be the same, the ratio of the sum of the capacitances of the capacitors $C_{1a}$ and $C_{1b}$ to the capacitance of the capacitor $C_{1c}$ to the capacitance of the capacitor $C_{1d}$ is a:1:1. Therefore, if the capacitance of the capacitor $C_{1c}$ is 1, the total of the capacitances of the capacitors in all of the tiers is 2+a, so it can be used for the denominator in Equation 5 shown above.

In the case that has been explained, where n=1, the first term in the numerator of Equation 5 represents a delay of one cycle from the sampling time, the second term in the numerator represents a delay of two cycles, and the third term in the numerator represents a delay of three cycles. Therefore, the first term in the numerator of Equation 5 corresponds to the output of the charge that was stored in the capacitor $C_{2c}$, the second term in the numerator corresponds to the charges that were stored in the capacitors $C_{1a}$ and $C_{1b}$, and the third term in the numerator corresponds to the output of the charge that was stored in the capacitor $C_{6d}$. Because the ratio of the sum of the capacitances of the capacitors $C_{1a}$ and $C_{1b}$ to the capacitance of the capacitor $C_{2c}$ (and the capacitor $C_{6d}$) is a:1, the respective charges can be used in the numerator in Equation 5 shown above.

It can therefore be seen that the charge domain filter circuit 200 that is shown in FIG. 10 satisfies Equation 5 and that the charge domain filter circuit 200 that is shown in FIG. 7 can be implemented by the circuit configuration that is shown in FIG. 10.

Note that the value of a in Equation 5 is determined by the ratio of the sum of the capacitances of the capacitors $C_{1a}$ and $C_{1b}$ to the capacitance of the capacitor $C_{1c}$. To illustrate with a simple example, assume that the capacitances of the capacitors $C_{1a}$, $C_{1b}$ are binary-weighted such that the capacitance ratio of the capacitor $C_{1a}$ to capacitor $C_{1c}$ is 0.5:1 and the capacitance ratio of the capacitor $C_{1b}$ to capacitor $C_{1c}$ is 1:1. Assuming that the capacitance of the capacitor $C_{1c}$ is 1, the sum of the capacitances of the capacitors $C_{1a}$ and $C_{1b}$ (that is, the value of a in Equation 5) can be set to any one of the four values of 0, 0.5, 1, and 1.5 by changing the states of the control logics A, B. Note that the value of a in Equation 5 can also be varied continuously by using variable capacitors whose capacitances can be continuously varied, instead of the capacitors $C_{1a}$ and $C_{1b}$. Using the variable capacitors makes it possible to continuously vary the normalized frequency characteristics.

Figure 12:
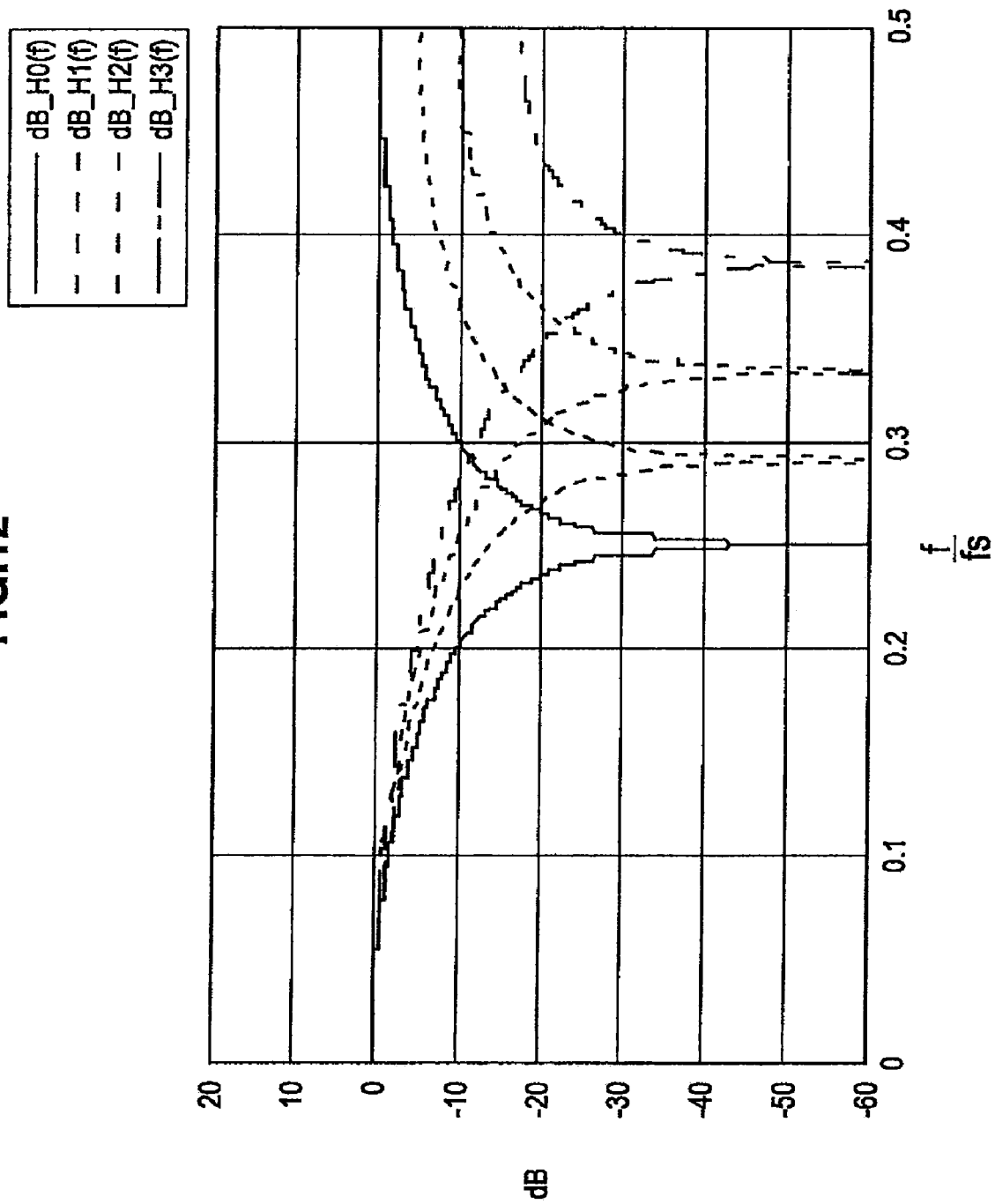
FIG. 12 is an explanatory figure that shows the normalized frequency characteristics of the charge domain filter circuit 200 according to the second embodiment of the present invention.

FIG. 12 is an explanatory figure that shows the normalized frequency characteristics of the charge domain filter circuit 200 according to the second embodiment of the present invention in a case where the value of a is varied among the four values of 0, 0.5, 1, and 1.5. In FIG. 12, dB_H0(f) shows the normalized frequency characteristics when the value of a is 0, dB_H1(f) shows the normalized frequency characteristics when the value of a is 0.5, dB_H2(f) shows the normalized frequency characteristics when the value of a is 1, and dB_H3(f) shows the normalized frequency characteristics when the value of a is 1.5. As shown in FIG. 12, it is possible to achieve normalized frequency characteristics with different positions for the notch frequencies by varying the value of a.

The operation of the charge domain filter circuit 200 according to the second embodiment of the present invention has been explained above. Note that in the present invention, a reverse phase signal may be input to the series of capacitors from the capacitors $C_{1a}$ and $C_{1b}$ to the capacitors $C_{6a}$ and $C_{6b}$ by differentiating the charge domain filter circuit 200. Inputting the reverse phase signal to the series of capacitors from the capacitors $C_{1a}$ and $C_{1b}$ to the capacitors $C_{6a}$ and $C_{6b}$ causes the value of a to become negative, making it possible to configure the charge domain filter circuit 200 such that it satisfies the transfer function shown in Equation 5.

As explained above, according to the second embodiment of the present invention, varying the value of a in Equation 5 by switching the capacitances of the capacitors makes it possible to set the positions of the notch frequencies without being limited to frequencies at which the integer portion of the sampling frequency is 1, as is the case in the first embodiment. Furthermore, in the same manner as in the first embodiment, the clock signals that are input to the charge domain filter circuit 200 are short-cycle clock signals with identical waveforms and differ only in their phases, so the clock signals are easy to generate, and the amount of electric power that is consumed can be kept low even when the circuit is operated at high speed. Finally, the waveforms of the clock signals that are input to the charge domain filter circuit 200 are simple, rectangular waves with short cycles, and low-frequency components are not included in the clock signal spectrum. Therefore, even if the clock signal spectrum temporarily becomes mixed into the passband of the filter, it can be easily eliminated.

Third Embodiment

The charge domain filter circuit 200 that was explained in the second embodiment of the present invention can change the frequency characteristics by integrating three signals that are sampled at different times. In a third embodiment of the present invention, a charge domain filter circuit will be explained that can change the frequency characteristics by integrating four signals that are sampled at different times.

Figure 13:
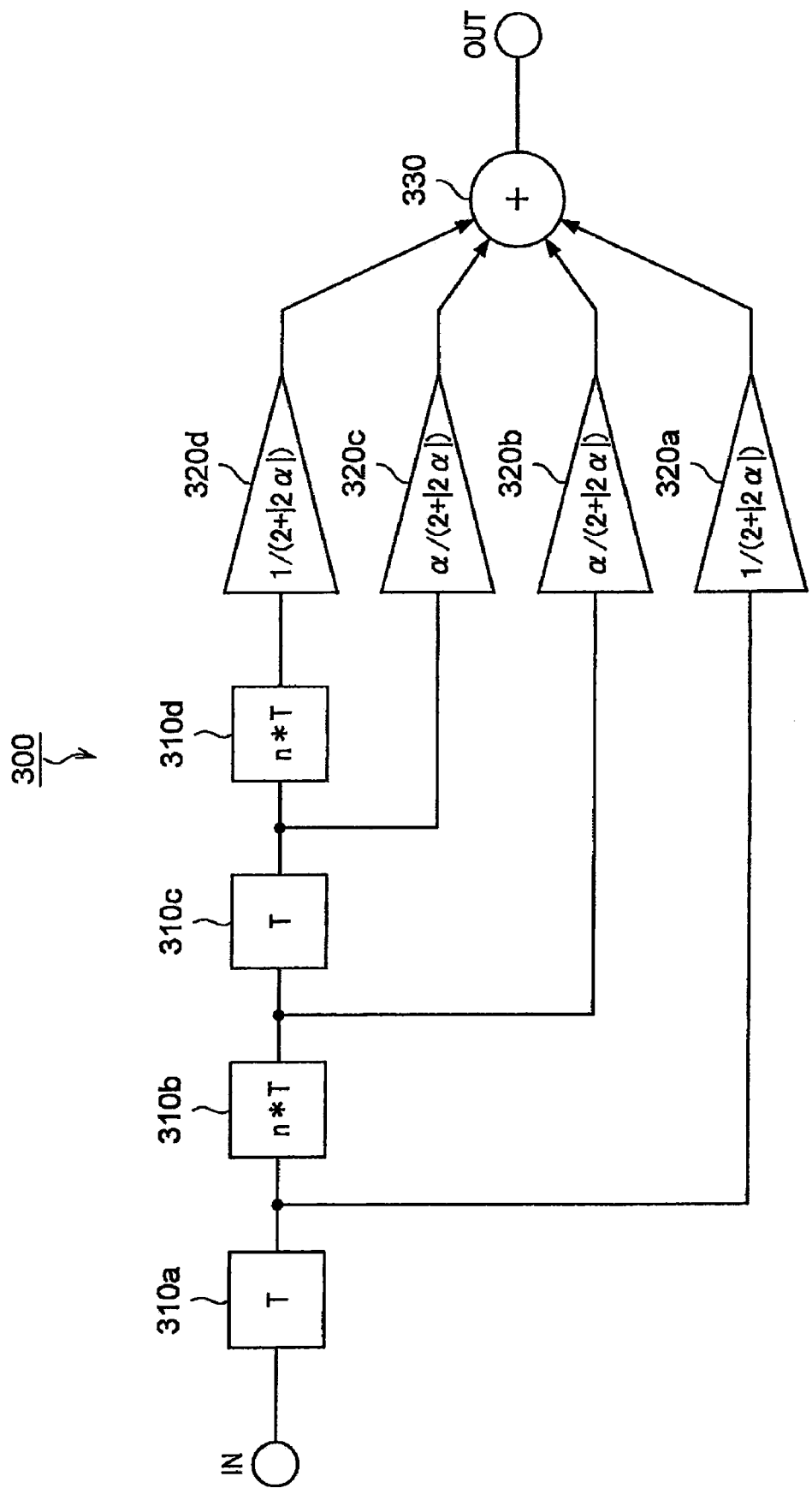
FIG. 13 is an explanatory figure that shows a configuration of a charge domain filter circuit 300 according to a third embodiment of the present invention.

FIG. 13 is an explanatory figure that uses a block diagram to explain a configuration of a charge domain filter circuit 300 according to the third embodiment of the present invention. The charge domain filter circuit 300 according to the third embodiment of the present invention will be explained below using FIG. 13.

As shown in FIG. 13, the charge domain filter circuit 300 according to the third embodiment of the present invention is an example of a FIR filter and is configured such that it includes delay registers 310a, 310b, 310c, 310d, multipliers 320a, 320b, 320c, 320d, and an adder 330.

In the same manner as in the charge domain filter circuit 100 according to the first embodiment of the present invention the charge domain filter circuit 200 according to the second embodiment of the present invention, a discrete-time signal that is sampled from a continuous-time signal at a sampling interval T is input to the charge domain filter circuit 300 from an input terminal IN. In the same way, the sampling frequency is expressed as $f_s$ (1/T). The delay register 310a outputs the sampled input signal after delaying for the time T from the time when the input signal was sampled. The signal that is output from the delay register 310a is input to the delay register 310b and the multiplier 320a. Note that the sampling interval T is a variable value that can be set as desired. The sampling interval T may also be varied in order to obtain the desired frequency characteristics.

After delaying for a time n×T (n times T, where n is an integer of 1 or greater), the delay register 310b outputs the signal that was output from the delay register 310a. That is, the output signal from the delay register 310b is a signal that is delayed for T (n+1) from the time when the signal was sampled. The output signal from the delay register 310b is input to the delay register 310c and the multiplier 320b.

After delaying for an additional time T, the delay register 310c outputs the signal that was output from the delay register 310b. That is, the output signal from the delay register 310c is a signal that is delayed for T (n+2) from the time when the signal was sampled. The output signal from the delay register 310c is input to the delay register 310d and the multiplier 320c. After delaying for a time n×T, the delay register 310d outputs the signal that was output from the delay register 310c. That is, the output signal from the delay register 310d is a signal that is delayed for T (2n+2) from the time when the signal was sampled. The output signal from the delay register 310d is input to the multiplier 320d.

The multiplier 320a multiplies the signal that was output from the delay register 310a by 1/(2+|2a|) and outputs the result. In the same manner, the multiplier 320b multiplies the signal that was output from the delay register 310b by a/(2+|2a|) and outputs the result, and the multiplier 320c also multiplies the signal that was output from the delay register 310c by a/(2+|2a|) and outputs the result. The multiplier 320d multiplies the signal that was output from the delay register 310d by 1/(2+|2a|) and outputs the result. The adder 330 adds together the output signals from the multipliers 320a, 320b, 320c, 320d and outputs the result.

Note that the reason for treating the value of a as an absolute value is that a negative value can be obtained for a, in the same manner as in the second embodiment. Specifically, the value of a can be made a negative value by differentiating the circuit and inputting a reverse phase signal to the delay registers 310b, 310d.

In this case, a satisfies Equation 8 below.

$$\alpha = \begin{cases} \sum_{k=1}^{n}(-1)^k 2\cos(k\theta)+1; n=1,3,5,\ldots \\ -\sum_{k=1}^{n}(-1)^k 2\cos(k\theta)-1; n=2,4,6,\ldots \end{cases} \quad \text{Equation 8}$$

$$\text{where } \theta = \frac{2\pi \cdot frel}{2(2n+1)}$$

Here, frel is the relative frequency when the lowest frequency at which a notch is formed is 1.0 in a case where a is zero. This means that the transfer function of the charge domain filter circuit 300 shown in FIG. 13 is as shown in Equation 9 below.

$$H(z) = \frac{z^{-1} + \alpha z^{-(n+1)} + \alpha z^{-(n+2)} + z^{-(2n+2)}}{2 + |2\alpha|} \quad \text{Equation 9}$$

For example, in a case where the coefficient a is set to zero when n=1, Equation 9 above becomes Equation 10 below.

$$H(z) = \frac{z^{-1} + z^{-4}}{2} \quad \text{Equation 10}$$

Figure 14:
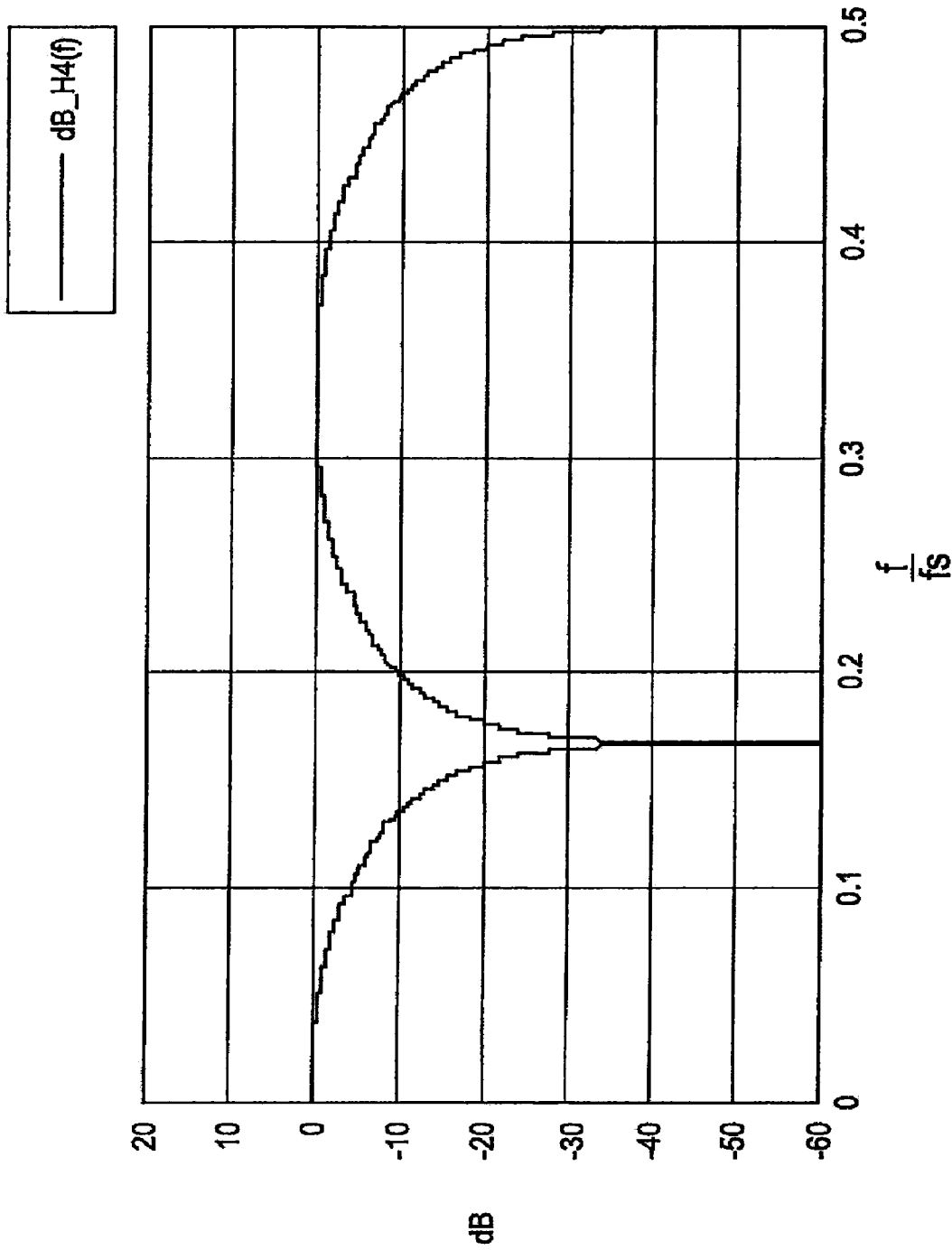
FIG. 14 is an explanatory figure that shows an example of normalized frequency characteristics of the charge domain filter circuit 300 shown in FIG. 13.

The frequency characteristics as normalized by the sampling frequency $f_s$ in this case are shown in FIG. 14. The line indicated by dB_H4(f) in the graph shown in FIG. 14 indicates the frequency characteristics as normalized by the sampling frequency $f_s$ in the case where the coefficient a is set to zero when n=1. As shown in FIG. 14, in the case where the coefficient a is set to zero when n=1, it can be seen that a notch forms where the normalized frequency $f/f_s$ is 0.167 (⅙). When the coefficient a is zero, the outputs from the multiplier 320b, 320c are also zero, which makes the charge domain filter circuit 300 a charge domain filter that integrates and outputs two signals. When two signals are integrated and output, the frequency at which the notch position forms (the notch frequency) is limited to a frequency at which the integer portion of the sampling frequency is 1.

Next, a case will be considered in which the notch frequency is raised by twenty percent. In order to raise the notch frequency by twenty percent, a is derived with the value of frel set to 1.2 in Equation 8. (The value of n is unchanged at 1.) This yields a value for a of 0.382. The transfer function for the charge domain filter circuit 300 when the value of a is 0.382 is shown in Equation 11 below.

$$H(z) = \frac{z^{-1} + 0.382z^{-(n+1)} + 0.382z^{-(n+2)} + z^{-(2n+2)}}{2.764} \quad \text{Equation 11}$$

Figure 15:
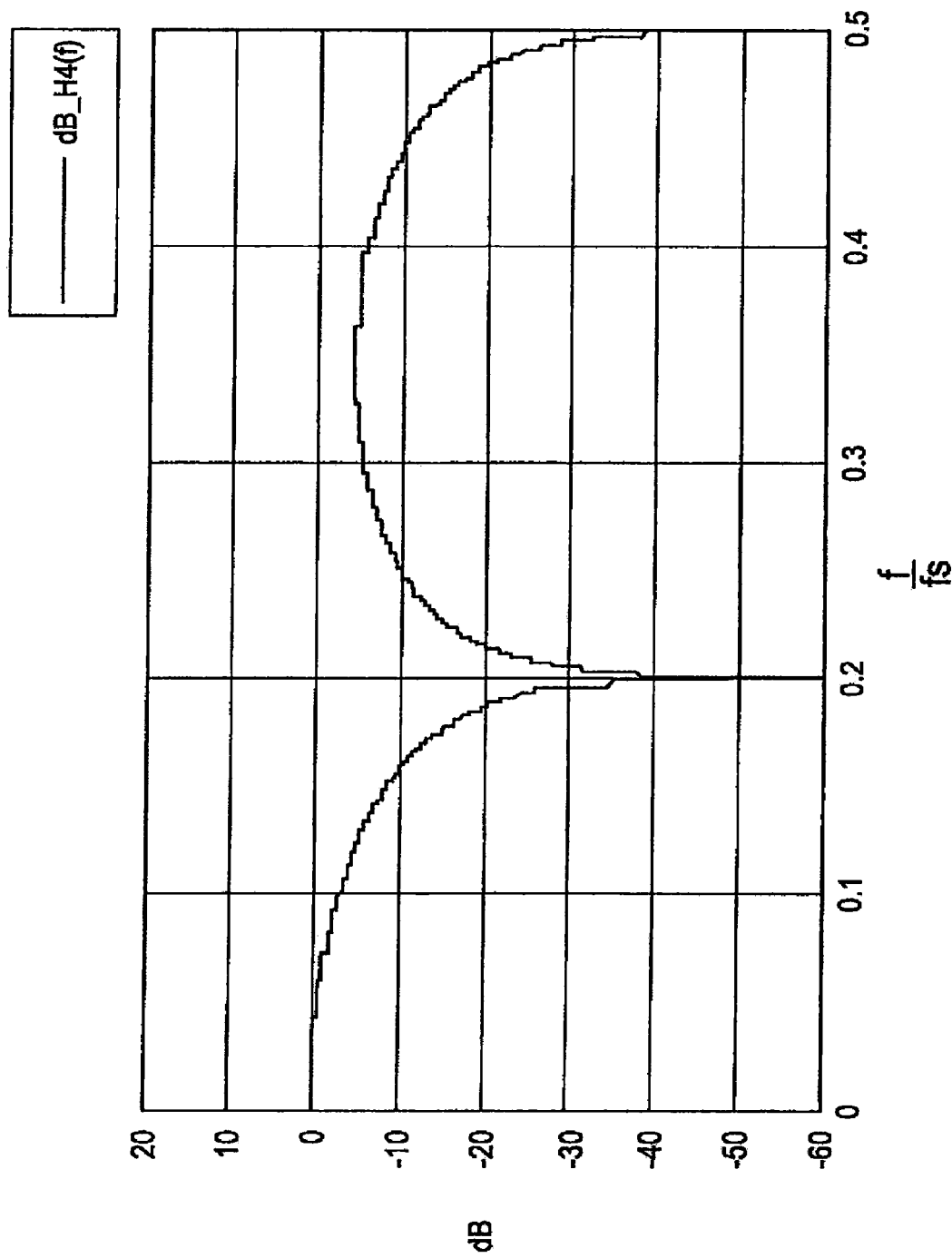
FIG. 15 is an explanatory figure that shows another example of the normalized frequency characteristics of the charge domain filter circuit 300 shown in FIG. 13.

In this case, the frequency characteristics as normalized by the sampling frequency $f_s$ are shown in FIG. 15. The line indicated by dB_H4(f) in the graph shown in FIG. 15 indicates the normalized frequency characteristics in this case. It can be seen that the position of the notch frequency (0.2) is twenty percent higher than in FIG. 14.

The charge domain filter circuit 300 according to the third embodiment of the present invention has been explained above.

As explained above, according to the charge domain filter circuit 300 according to the third embodiment of the present invention, the frequency characteristics of the charge domain filter circuit 300 can be changed by integrating the four signals that are sampled at different times and varying the sampling timing such that the value of a is varied.

Fourth Embodiment

Next, a charge domain filter circuit according to a fourth embodiment of the present invention will be explained. The fourth embodiment of the present invention that is explained below varies the frequency characteristics by combining two of the charge domain filter circuits shown in the second embodiment of the present invention.

Figure 16:
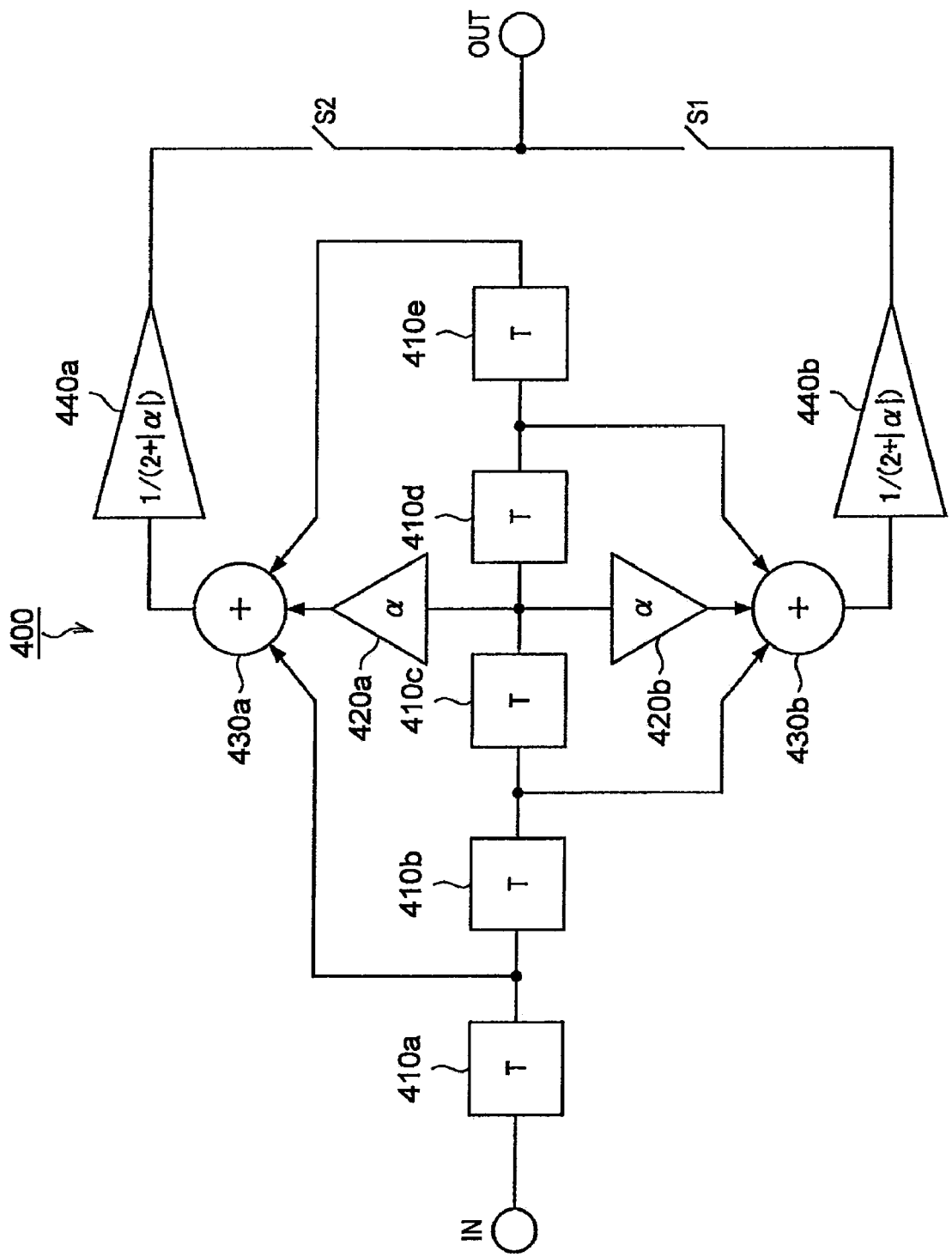
FIG. 16 is an explanatory figure that shows a configuration of a charge domain filter circuit 400 according to a fourth embodiment of the present invention.
Figure 17:
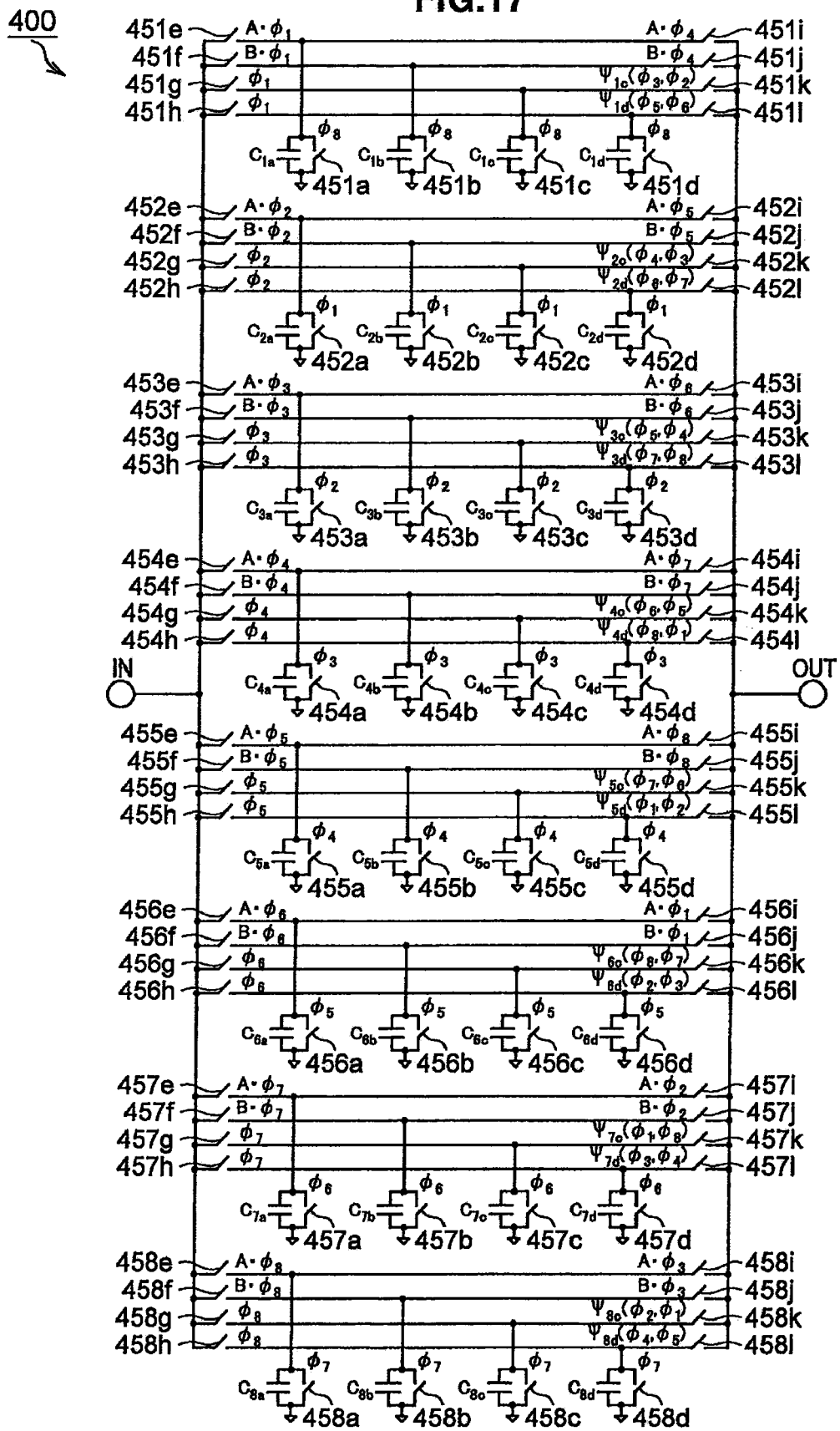
FIG. 17 is an explanatory figure that shows an example of a circuit in a case where the charge domain filter circuit 400 according to the fourth embodiment of the present invention is implemented as an actual circuit.

FIG. 16 is an explanatory figure that shows a charge domain filter circuit 400 according to the fourth embodiment of the present invention. FIG. 17 is an explanatory figure that shows an example of a circuit in a case where the charge domain filter circuit 400 according to the fourth embodiment of the present invention shown in FIG. 16 is implemented as an actual circuit. The configuration of the charge domain filter circuit 400 will be explained below with reference to FIGS. 16 and 17.

As shown in FIG. 16, the charge domain filter circuit 400, which is an example of the fourth embodiment of the present invention, is configured such that it includes delay registers 410a, 410b, 410c, 410d, 410e, multipliers 420a, 420b, 440a, 440b, and adders 430a, 430b.

In the same manner as in the first to the third embodiments described above, a discrete-time signal that is sampled from a continuous-time signal at a sampling interval T is input from an input terminal IN to the charge domain filter circuit 400 shown in FIG. 16. The sampling frequency is expressed as $f_s$ (1/T). The delay registers 410a, 410b, 410c, 410d, 410e each output the input signal after delaying for the time T. Note that the sampling interval T is a variable value that can be set as desired. The sampling interval T may also be varied in order to obtain the desired frequency characteristics.

The multipliers 420a, 420b each multiply the signal that is output from the delay register 410c by the coefficient a and output the results. The adder 430a adds together the outputs from the delay register 410a, the multiplier 420a, and the delay register 410e and outputs the result. In the same manner, the adder 430b adds together the outputs from the delay registers 410b, the multiplier 420b, and the delay register 410d and outputs the result. The multipliers 440a, 440b respectively multiply the signals that are output from the adders 430a, 430b by 1/(2+|a|) and output the results.

By switching the switches S1, S2 on and off, the charge domain filter circuit 400 that is shown in FIG. 16 can be made to correspond to the charge domain filter circuit 200 according to the second embodiment of the present invention that is shown in FIG. 7 in the cases where the value of n is set to 1 and to 2.

FIG. 17 is an explanatory figure that shows an example of a circuit in the case where the charge domain filter circuit 400 according to the fourth embodiment of the present invention shown in FIG. 16 is implemented as an actual circuit that is configured from switches and capacitors. As shown in FIG. 17, the charge domain filter circuit 400 according to the fourth embodiment of the present invention has an eight-tier configuration in which each tier is configured from a grouping of twelve switches and four capacitors. A charge is repeatedly input to the capacitors from an input terminal IN, and a charge is repeatedly discharged from the capacitors to an output terminal OUT, by switching the individual switches as necessary.

Figure 18:
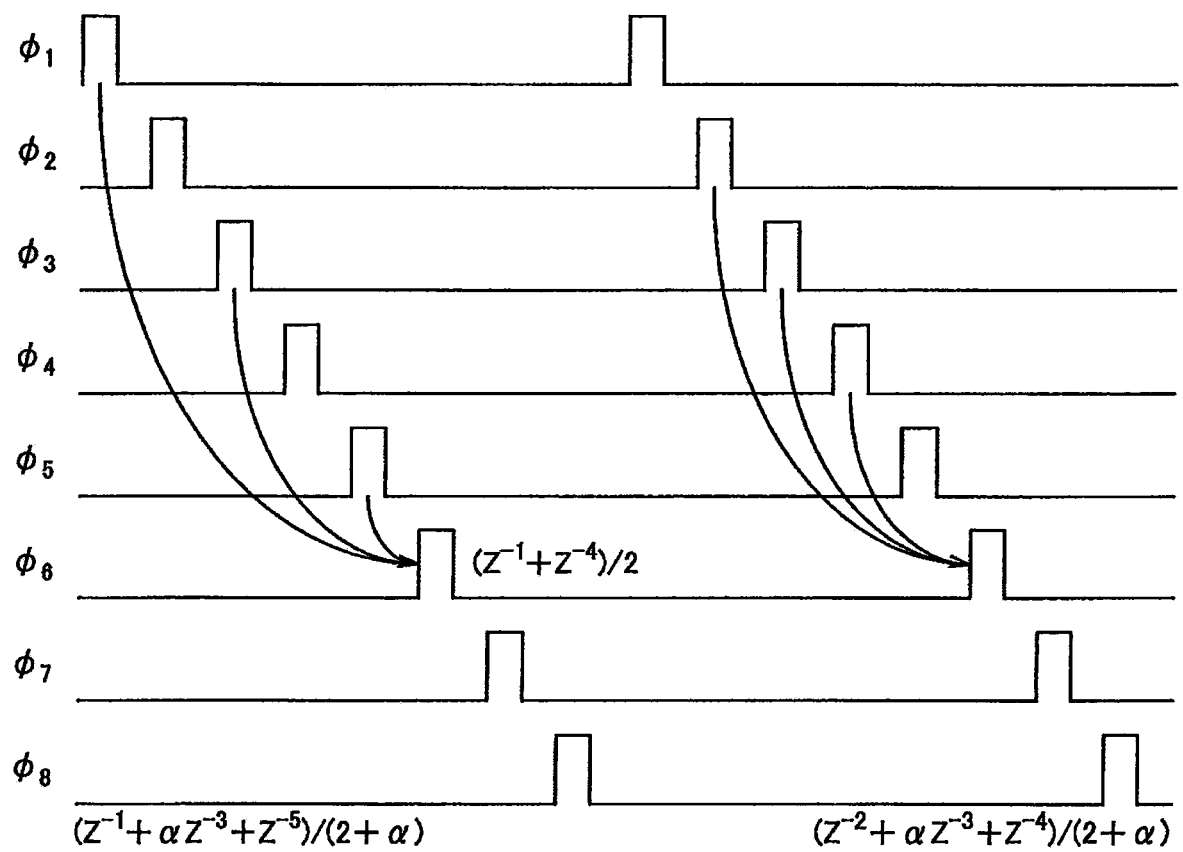
FIG. 18 is an explanatory figure that shows waveforms of clock signals that are input to the charge domain filter circuit 400 according to the fourth embodiment of the present invention, shown in FIG. 17.

FIG. 18 is an explanatory figure that shows waveforms of clock signals that are input to the charge domain filter circuit 400 according to the fourth embodiment of the present invention that is shown in FIG. 17. In the clock signals shown in FIG. 18, the intervals between the rising edges of adjacent clock signals corresponds to the sampling interval T described above. The clock signals $\phi_1$ to $\phi_8$ in FIG. 18 respectively correspond to the symbols ($\phi_1$, $\phi_2$, $\phi_3$, $\phi_4$, $\phi_5$, $\phi_6$, $\phi_7$, $\phi_8$) for various switches in FIG. 17. When any one of the clock signals $\phi_1$ to $\phi_8$ in FIG. 18 becomes high, the switches shown in FIG. 17 that correspond to the clock signal become on. Therefore, repeatedly turning the clock signals $\phi_1$ to $\phi_8$ in FIG. 18 to high and low causes charges to be accumulated in the various capacitors shown in FIG. 17 and causes the signal sampling to be performed.

The letters A and B are also placed next to some of the switches in addition to the symbols that are used for the switches and that correspond to the clock signals. For example, the label A·$\phi_1$ for the switch 451e indicates that clock gating is performed for the clock signal $\phi_1$ by a control logic A. Specifically, if the control logic A is 1, the switch 451e turns on and off according to whether the clock signal $\phi_1$ is in a high or a low state, and if the control logic A is zero, the switch 451e is off, regardless of whether the clock signal $\phi_1$ is in a high or a low state.

The symbol $\psi$ is used in FIG. 17 to indicate a switch that is turned on by one clock signal. For example, $\psi_{1c}$ ($\phi_3$, $\phi_2$) indicates that the switch 451k becomes on when either one of the clock signals $\phi_2$, $\phi_3$ becomes high. Further, $\psi_{1c}$ to $\psi_{8c}$ and $\psi_{1d}$ to $\psi_{8d}$ indicate switches that become on when the clock signals that are shown in the corresponding positions become high. For example, in a case where the switch 451k becomes on when the clock signal $\phi_3$ becomes high, the switch 451l becomes on when the clock signal $\phi_5$ becomes high, the switch 452k becomes on when the clock signal $\phi_4$ becomes high, and the switch 452l becomes on when the clock signal $\phi_6$ becomes high. Hereinafter, the same applies to all of the switches that are marked with the symbol $\psi$.

Note that for the switches that are marked with the symbol $\psi$, the turning on and off in response to the respective clock signals corresponds to the turning on and off of the switches S1, S2 that are shown in FIG. 16. Therefore, the cases where the value of n is set to 1 and to 2 can each be selected by selecting the clock signals to which the switches respond.

For the twenty-four capacitors shown in FIG. 17, it is preferable for all of the vertically aligned capacitors to have the same capacitance, in the same manner as in the charge domain filter circuit 200 according to the second embodiment of the present invention shown in FIG. 10. For example, it is preferable for all of the capacitors $C_{1a}$, $C_{2a}$, $C_{3a}$, $C_{4a}$, $C_{5a}$, $C_{6a}$ to have the same capacitance. It is also preferable for the c and d capacitors within each tier, the capacitors $C_{1c}$ and $C_{1d}$, the capacitors $C_{2c}$ and $C_{2d}$, the capacitors $C_{3c}$ and $C_{3d}$, the capacitors $C_{4c}$ and $C_{4d}$, the capacitors $C_{5c}$ and $C_{5d}$, and the capacitors $C_{6c}$ and $C_{6d}$, to have the same capacitance, in the same manner as in the charge domain filter circuit 200 according to the second embodiment of the present invention shown in FIG. 10. Taking the first tier as an example, the value of a in Equation 5 above can be determined by normalizing the capacitances of the capacitors $C_{1a}$ and $C_{1b}$ by the capacitance of the capacitor $C_{1c}$.

One of a MOSFET and a CMOSFET may be used for each switch in the charge domain filter circuit 400 according to the fourth embodiment of the present invention that is shown in FIG. 17.

The charge domain filter circuit 400 that is shown in FIG. 17 is a filter with the same sampling rate for both input and output, making it possible to switch the notch positions of the normalized frequency characteristics in eight different ways. The configuration of the charge domain filter circuit 400 according to the fourth embodiment of the present invention has been explained above. Next, the operation of the charge domain filter circuit 400 according to the fourth embodiment of the present invention will be explained.

Focusing first on capacitors $C_{2a}$, $C_{2b}$, $C_{2c}$, $C_{2d}$, when the clock signal $\phi_1$ becomes high, the switches 452a, 452b, 452c, 452d all become on, grounding the capacitors $C_{2a}$, $C_{2b}$, $C_{2c}$, $C_{2d}$. The residual charges in the capacitors $C_{2a}$, $C_{2b}$, $C_{2c}$, $C_{2d}$ are therefore discharged, and the capacitors $C_{2a}$, $C_{2b}$, $C_{2c}$, $C_{2d}$ are reset.

When the clock signal $\phi_2$ becomes high, the switches 452a, 452b, 452c, 452d all become off, and the switches 452g, 452h both become on, connecting the capacitors $C_{2c}$, $C_{2d}$ to the input terminal IN such that charges are accumulated in the capacitors $C_{2c}$, $C_{2d}$. Whether the switches 452e, 452f become on or not is determined by the states of the control logics A, B. The states of the control logics A, B also determine whether or not charges are accumulated in the capacitors $C_{2a}$, $C_{2b}$. To make the explanation easier to understand, the present example will be explained with the control logics A, B both set to 1. In a case where the control logics A, B are both 1, when the clock signal $\phi_2$ becomes high, the switches 452e, 452f become on, such that the capacitors $C_{2a}$, $C_{2b}$ are connected to the input terminal IN and charges are accumulated in the capacitors $C_{2a}$, $C_{2b}$.

When one of the clock signal $\phi_3$ and $\phi_4$ becomes high, the switches 452e, 452f, 452g, 452h all become off, and the switch 452k becomes on, causing the charge that is stored in the capacitor $C_{2c}$ to be output to the output terminal OUT. For the purpose of this explanation, it will be assumed that the switch 452k becomes on, and the charge that is stored in the capacitor $C_{2c}$ is output to the output terminal OUT, when the clock signal $\phi_4$ becomes high. That is, a case will be explained that corresponds to the case where n=1 in the charge domain filter circuit 200 in FIG. 7.

In this case, other switches that also become on when the clock signal $\phi_4$ becomes high are the switches 451i, 451j, 458l. Accordingly, when the clock signal $\phi_4$ becomes high, the charges that are stored in the capacitors $C_{1a}$, $C_{1b}$, $C_{8d}$ are also output to the output terminal OUT. The charges that are stored in the capacitors $C_{1a}$, $C_{1b}$ were accumulated when the clock signal $\phi_1$ became high, three sampling cycles before the clock signal $\phi_4$. The charge that is stored in the capacitor $C_{8d}$ was accumulated when the clock signal $\phi_8$ became high, four sampling cycles before the clock signal $\phi_4$.

The accumulating and discharging of the charges is repeatedly performed in the same manner in each sampling cycle, even for the capacitors in the other tiers, so the sampling rate is the same for both input and output.

Next, the capacitance ratios of the capacitors in each of the tiers will be explained using a. For example, the ratio of the sum of the capacitances of the capacitors $C_{1a}$ and $C_{1b}$ to the capacitance of the capacitor $C_{1c}$ may be a:1. In that case, because it is preferable for the capacitance of the capacitor $C_{1c}$ and the capacitance of the capacitor $C_{1d}$ to be the same, the ratio of the sum of the capacitances of the capacitors $C_{1a}$ and $C_{1b}$ to the capacitance of the capacitor $C_{1c}$ to the capacitance of the capacitor $C_{1d}$ is a:1:1. Therefore, if the capacitance of the capacitor $C_{1c}$ is 1, the total of the capacitances of the capacitors in all of the tiers is 2+a, so it can be used for the denominator in Equation 5 shown above.

In the case that has been explained, where n=1, the first term in the numerator of Equation 5 represents a delay of one cycle from the sampling time, the second term in the numerator represents a delay of two cycles, and the third term in the numerator represents a delay of three cycles. Therefore, the first term in the numerator of Equation 5 corresponds to the output of the charge that was stored in the capacitor $C_{2c}$, the second term in the numerator corresponds to the charges that were stored in the capacitors $C_{1a}$ and $C_{1b}$, and the third term in the numerator corresponds to the output of the charge that was stored in the capacitor $C_{8d}$. Because the ratio of the sum of the capacitances of the capacitors $C_{1a}$ and $C_{1b}$ to the capacitance of the capacitor $C_{2c}$ (and the capacitor $C_{8d}$) is a:1, the respective charges can be used in the numerator in Equation 5 shown above. The transfer function is shown in Equation 12.

$$H(z) = \frac{z^{-2} + \alpha z^{-3} + z^{-4}}{2 + |\alpha|}.$$ Equation 12

Note that in Equation 12, all of the sampling times are delayed by one cycle more than when 1 is substituted for n in Equation 5, but because the delay is one cycle for all of the sampling times, there is absolutely no effect on the frequency characteristics.

The case where n=1 has been explained above. Next, the same sort of operation will be explained in a case where the switch $452k$ becomes on and the charge that is stored in the capacitor $C_{2c}$ is output to the output terminal OUT when the other clock signal $\phi_3$ becomes high, that is, a case that corresponds to the case where n=2 in the charge domain filter circuit 200 in FIG. 7.

Other switches that also become on when the clock signal $\phi_3$ becomes high are the switches $458i$, $458j$, $456l$. Accordingly, when the clock signal $\phi_3$ becomes high, the charges that are stored in the capacitors $C_{8a}$, $C_{8b}$, $C_{6d}$ are also output to the output terminal OUT. The charges that are stored in the capacitors $C_{8a}$, $C_{8b}$ were accumulated when the clock signal $\phi_8$ became high, three sampling cycles before the clock signal $\phi_3$. The charge that is stored in the capacitor $C_{6d}$ was accumulated when the clock signal $\phi_6$ became high, five sampling cycles before the clock signal $\phi_3$.

Next, the capacitance ratios of the capacitors in each of the tiers will be explained using a. For example, the ratio of the sum of the capacitances of the capacitors $C_{1a}$ and $C_{1b}$ to the capacitance of the capacitor $C_{1c}$ may be a:1. In that case, because it is preferable for the capacitance of the capacitor $C_{1c}$ and the capacitance of the capacitor $C_{1d}$ to be the same, the ratio of the sum of the capacitances of the capacitors $C_{1a}$ and $C_{1b}$ to the capacitance of the capacitor $C_{1c}$ to the capacitance of the capacitor $C_{1d}$ is a:1:1. Therefore, if the capacitance of the capacitor $C_{1c}$ is 1, the total of the capacitances of the capacitors in all of the tiers is 2+a, so it can be used for the denominator in Equation 5 shown above, in the same manner as in the case where n=1.

In the case that has been explained, where n=2, the first term in the numerator of Equation 5 represents a delay of one cycle from the sampling time, the second term in the numerator represents a delay of three cycles, and the third term in the numerator represents a delay of five cycles. Therefore, the first term in the numerator of Equation 5 corresponds to the output of the charge that was stored in the capacitor $C_{2c}$, the second term in the numerator corresponds to the charges that were stored in the capacitors $C_{8a}$ and $C_{8b}$, and the third term in the numerator corresponds to the output of the charge that was stored in the capacitor $C_{6d}$. Because the ratio of the sum of the capacitances of the capacitors $C_{8a}$ and $C_{8b}$ to the capacitance of the capacitor $C_{2c}$ (and the capacitor $C_{6d}$) is a:1, the respective charges can be used in the numerator in Equation 5 shown above. The transfer function is shown in Equation 13.

$$H(z) = \frac{z^{-1} + \alpha z^{-3} + z^{-5}}{2 + |\alpha|}$$ Equation 13

The case where n=2 has been explained above. It can thus be seen that the charge domain filter circuit 400 according to the fourth embodiment of the present invention that is shown in FIG. 17 can be used to configure the charge domain filter circuit 400 that is shown in FIG. 16.

Note that the value of a in Equation 12 and Equation 13 is determined by the ratio of the sum of the capacitances of the capacitors $C_{1a}$ and $C_{1b}$ to the capacitance of the capacitor $C_{1c}$, in the same manner as the value of a in Equation 5. To illustrate with a simple example, assume that the capacitances of the capacitors $C_{1a}$, $C_{1b}$ are binary-weighted such that the capacitance ratio of the capacitor $C_{1a}$ to capacitor $C_{1c}$ is 0.5:1 and the capacitance ratio of the capacitor $C_{1b}$ to capacitor $C_{1c}$ is 1:1. Assuming that the capacitance of the capacitor $C_{1c}$ is 1, the sum of the capacitances of the capacitors $C_{1a}$ and $C_{1b}$ (that is, the value of a in Equation 12 and Equation 13) can be set to any one of the four values of 0, 0.5, 1, and 1.5 by changing the states of the control logics A, B. Note that the value of a in Equation 12 and Equation 13 can also be varied continuously by using variable capacitors whose capacitances can be continuously varied, instead of the capacitors $C_{1a}$ and $C_{1b}$. Using the variable capacitors makes it possible to continuously vary the normalized frequency characteristics.

Figure 19:
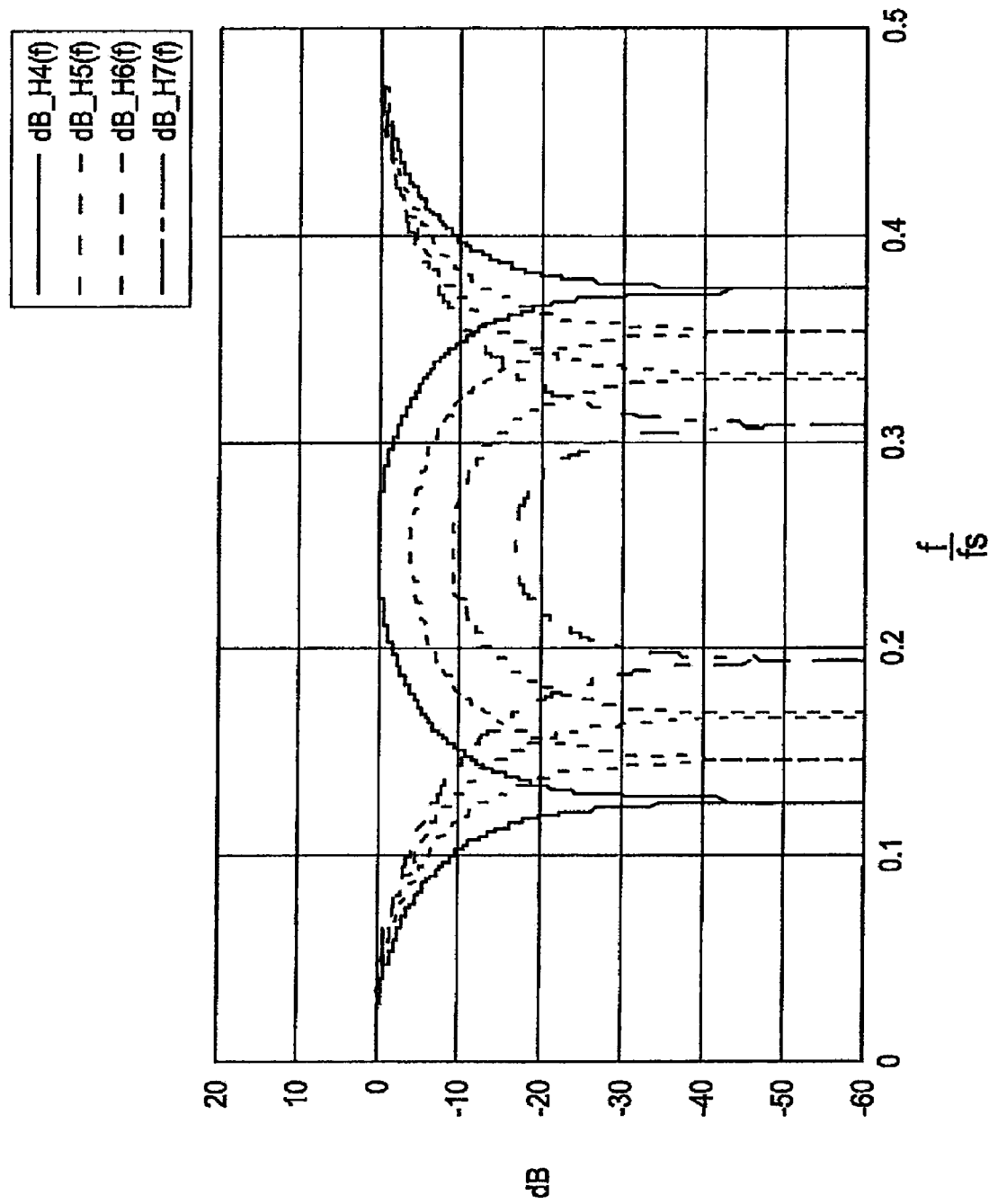
FIG. 19 is an explanatory figure that shows normalized frequency characteristics of the charge domain filter circuit 400 according to the fourth embodiment of the present invention.
Figure 20:
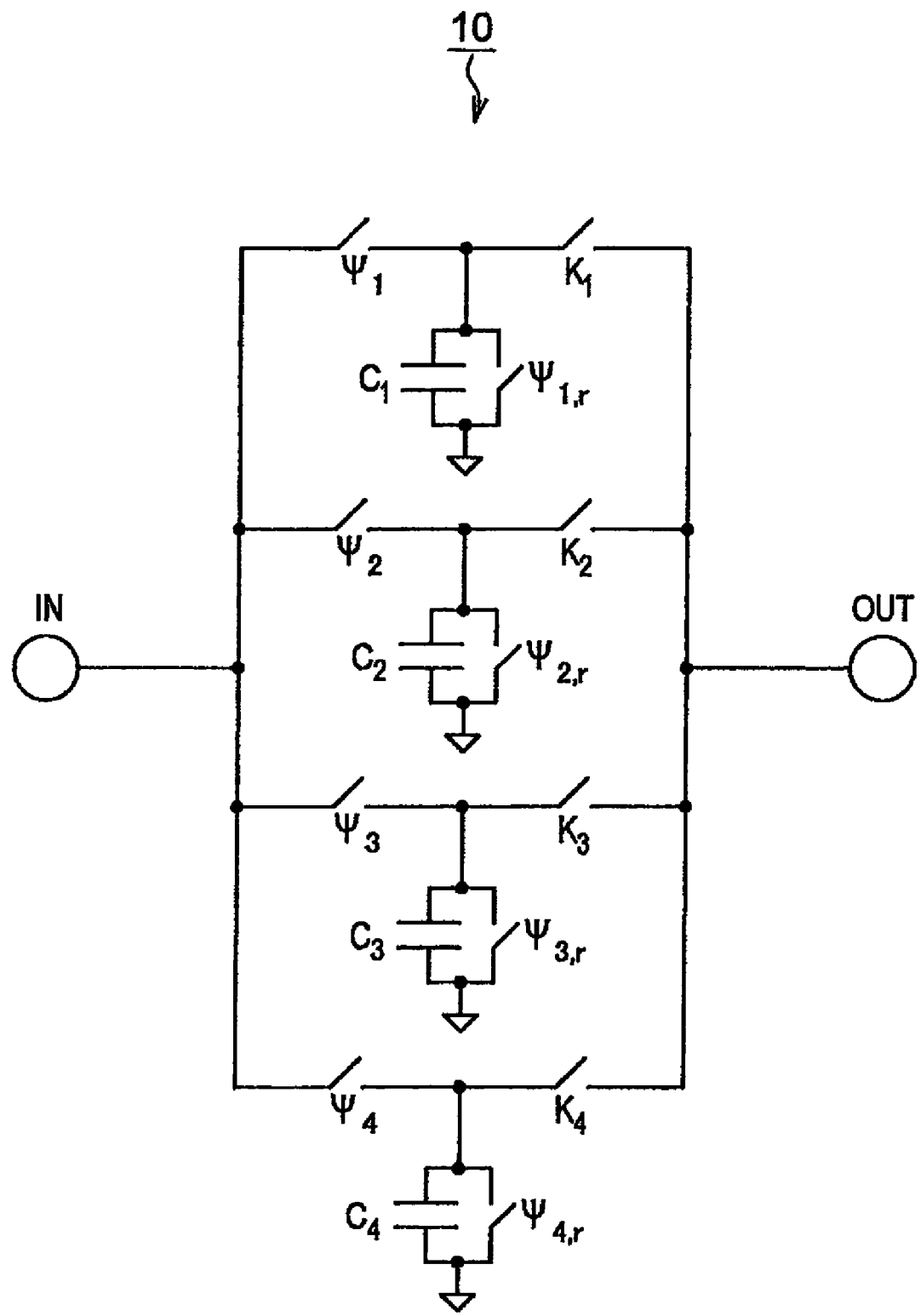
FIG. 20 is an explanatory figure that shows a known charge domain filter circuit that has reconfigurable filter characteristics.
Figure 21A:
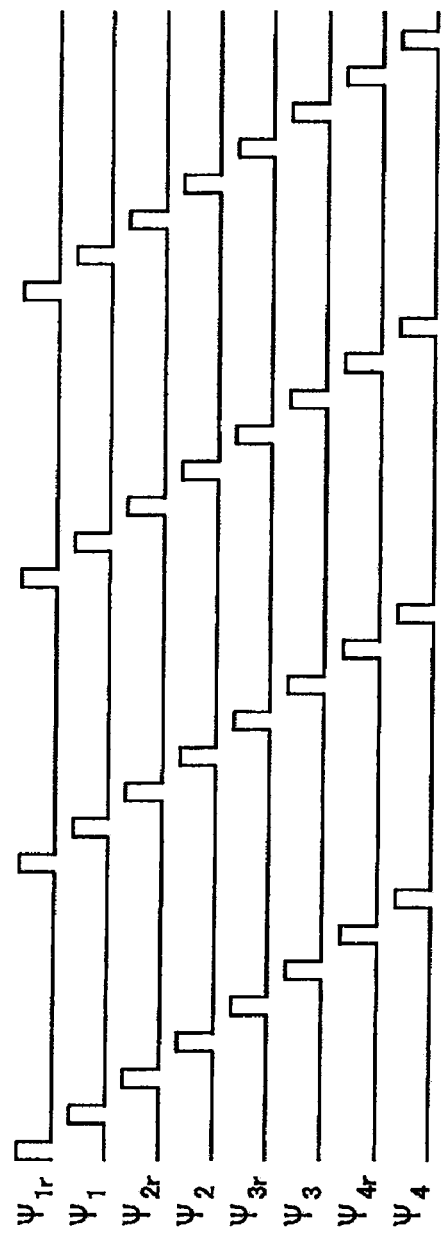
FIG. 21A is an explanatory figure that shows waveforms of clock signals that are input to a charge domain filter circuit 10 in FIG. 20.
Figure 21B:
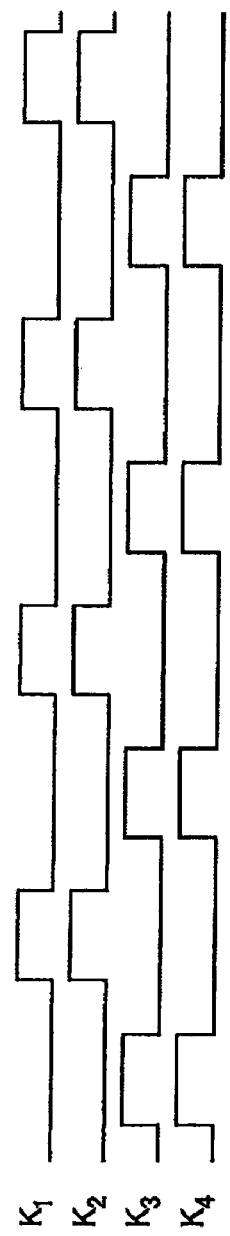
FIG. 21B is an explanatory figure that shows waveforms of clock signals that are input to a charge domain filter circuit 10 in FIG. 20.
Figure 21C:
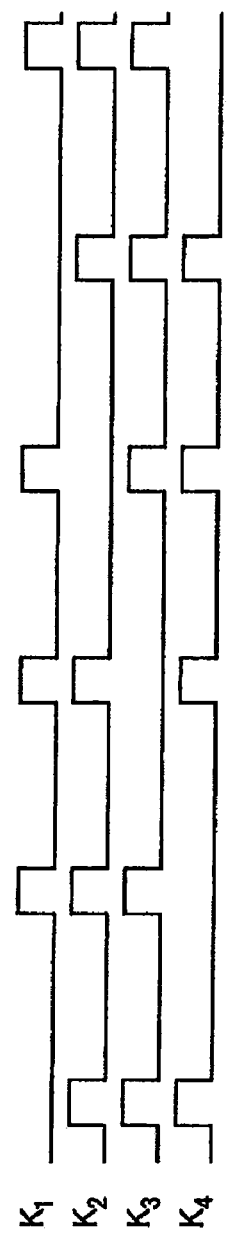
FIG. 21C is an explanatory figure that shows waveforms of clock signals that are input to a charge domain filter circuit 10 in FIG. 20.

The normalized frequency characteristics in the cases where the value of a is set to 0, 0.5, 1, and 1.5 when n=1 have the same characteristics as the normalized frequency characteristics in the cases where the value of a is set to the four values of 0, 0.5, 1, and 1.5 in the charge domain filter circuit 200 according to the second embodiment of the present invention shown in FIG. 12. FIG. 19 is an explanatory figure that shows the normalized frequency characteristics of the charge domain filter circuit 400 according to the fourth embodiment of the present invention in a case where the value of a is varied among the four values of 0, 0.5, 1, and 1.5. In FIG. 19, dB_H4($f$) shows the normalized frequency characteristics when the value of a is 0, dB_H5($f$) shows the normalized frequency characteristics when the value of a is 0.5, dB_H6($f$) shows the normalized frequency characteristics when the value of a is 1, and dB_H7($f$) shows the normalized frequency characteristics when the value of a is 1.5. As shown in FIG. 19, it is possible to achieve normalized frequency characteristics with different positions for the notch frequencies by varying the value of a. In addition, changing the value of n changes the order of the filter and changes the notch frequency significantly.

The operation of the charge domain filter circuit 400 according to the fourth embodiment of the present invention has been explained above. Note that in the present invention, a reverse phase signal may be input to the series of capacitors from the capacitors $C_{1a}$ and $C_{1b}$ to the capacitors $C_{8a}$ and $C_{8b}$ by differentiating the charge domain filter circuit 400. Inputting the reverse phase signal to the series of capacitors from the capacitors $C_{1a}$ and $C_{1b}$ to the capacitors $C_{8a}$ and $C_{8b}$ causes the value of a to become negative, making it possible to configure the charge domain filter circuit 400 such that it satisfies the transfer functions shown in Equation 12 and Equation 13.

As explained above, according to the charge domain filter circuit 400 according to the fourth embodiment of the present invention, varying the value of a in Equation 12 and Equation 13 by switching the capacitances of the capacitors makes it possible to set the positions of the notch frequencies without being limited to frequencies at which the integer portion of the sampling frequency is 1, as is the case in the first embodiment of the present invention. Furthermore, in the same manner as in the first embodiment of the present invention, the clock signals that are input to the charge domain filter circuit 400 are short-cycle clock signals with identical waveforms and differ only in their phases, so the clock signals are easy to generate, and the amount of electric power that is consumed can be kept low even when the circuit is operated at high speed. Finally, the waveforms of the clock signals that are input to the charge domain filter circuit 400 are simple, rectangular waves with short cycles, and low-frequency components are not included in the clock signal spectrum. Therefore, even if the clock signal spectrum temporarily becomes mixed into the passband of the filter, it can be easily eliminated.

It should be understood by those skilled in the art that various modifications, combinations, sub-combinations and alterations may occur depending on design requirements and other factors insofar as they are within the scope of the appended claims or the equivalents thereof.

What is claimed is:

1. A charge domain circuit, comprising:
   an input;
   a first signal output portion coupled to the input, the first signal output portion comprising:
      a first plurality of delay registers for sampling an input signal from the input at a specified time interval, the first plurality of delay registers performing no multiplication of the input signal;
      a first adder coupled after the first plurality of delay registers;
      a first multiplier coupled after the first adder; and
      a first switch coupled after the first multiplier for outputting a first signal;
   a second signal output portion coupled to the input, the second signal output portion comprising:
      a second plurality of delay registers for sampling the input signal, the second plurality of delay registers performing no multiplication of the input signal;
      a second adder coupled after the second plurality of delay registers;
      a second multiplier coupled after the second adder; and
      a second switch coupled after the second multiplier for outputting a second signal; and
   an output coupled to the first switch and the second switch.

2. The charge domain circuit according to claim 1, further comprising:
   a clock signal generation portion that generates a plurality of clock signals that are input to the second signal output portion,
   wherein the second signal output portion is capable of selecting the time to sample the second signal by selecting and inputting one of the clock signals that is generated by the clock signal generation portion.

3. The charge domain circuit according to claim 1, wherein the specified time interval is variable.

* * * * *